(12) United States Patent
Tao et al.

(10) Patent No.: US 12,416,854 B2
(45) Date of Patent: Sep. 16, 2025

(54) MACHINE LEARNING BASED SUBRESOLUTION ASSIST FEATURE PLACEMENT

(71) Applicant: ASML NETHERLANDS B.V., Veldhoven (NL)

(72) Inventors: Jun Tao, Cupertino, CA (US); Yu Cao, Saratoga, CA (US); Christopher Alan Spence, Los Altos, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 622 days.

(21) Appl. No.: 17/907,756

(22) PCT Filed: Feb. 12, 2021

(86) PCT No.: PCT/EP2021/053569
§ 371 (c)(1),
(2) Date: Aug. 29, 2022

(87) PCT Pub. No.: WO2021/175570
PCT Pub. Date: Sep. 10, 2021

(65) Prior Publication Data
US 2023/0107556 A1 Apr. 6, 2023

Related U.S. Application Data

(60) Provisional application No. 62/984,396, filed on Mar. 3, 2020.

(51) Int. Cl.
*G03F 1/36* (2012.01)
*G03F 7/00* (2006.01)
(Continued)

(52) U.S. Cl.
CPC ............ *G03F 1/36* (2013.01); *G03F 7/70441* (2013.01); *G03F 7/706841* (2023.05); *G06F 30/27* (2020.01); *G06F 30/398* (2020.01)

(58) Field of Classification Search
None
See application file for complete search history.

(56) References Cited

U.S. PATENT DOCUMENTS

| | | |
|---|---|---|
| 5,229,872 A | 7/1993 | Mumola |
| 7,376,930 B2 | 5/2008 | Wampler et al. |

(Continued)

FOREIGN PATENT DOCUMENTS

| | | |
|---|---|---|
| CN | 109491195 | 3/2019 |
| CN | 109976087 | 7/2019 |

(Continued)

OTHER PUBLICATIONS

X. Ma et al., "Fast pixel-based optical proximity correction based on nonparametric kernel regression," J. Micro/Nanolith. MEMS MOEMS 13(4), Oct.-Dec. 2014, 12 pages. (Year: 2014).*

(Continued)

*Primary Examiner* — Leigh M Garbowski
(74) *Attorney, Agent, or Firm* — Pillsbury Winthrop Shaw Pittman, LLP

(57) ABSTRACT

A method for training a machine learning model to generate a characteristic pattern, the method includes obtaining training data associated with a reference feature in a reference image. The training data includes (i) location data of each portion of the reference feature, and (ii) a presence value indicating whether the portion of the reference feature is located within a reference assist feature generated for the reference feature. The method includes training the machine learning model to predict a presence value based on the actual presence value in the training data. The predicted presence value indicates whether a portion of a feature (e.g., a skeleton point on a skeleton of a contour of the feature) is to be covered by an assist feature. The training is performed based on the training data such that a metric between a (Continued)

predicted presence value and the presence value is minimized.

20 Claims, 20 Drawing Sheets

(51) Int. Cl.
*G06F 30/27* (2020.01)
*G06F 30/30* (2020.01)
*G06F 30/398* (2020.01)

(56) References Cited

U.S. PATENT DOCUMENTS

| | | | |
|---|---|---|---|
| 11,815,820 B2* | 11/2023 | Moon | G03F 1/36 |
| 11,972,194 B2* | 4/2024 | Biswas | G06F 30/392 |
| 2006/0066855 A1 | 3/2006 | Boef et al. | |
| 2007/0031745 A1 | 2/2007 | Ye et al. | |
| 2007/0050749 A1 | 3/2007 | Ye et al. | |
| 2008/0301620 A1 | 12/2008 | Ye et al. | |
| 2008/0309897 A1 | 12/2008 | Wong et al. | |
| 2009/0157630 A1 | 6/2009 | Yuan | |
| 2010/0162197 A1 | 6/2010 | Ye et al. | |
| 2010/0180251 A1 | 7/2010 | Ye et al. | |
| 2017/0038692 A1 | 2/2017 | Hsu et al. | |
| 2018/0095359 A1 | 4/2018 | Jeong | |
| 2018/0341740 A1 | 11/2018 | Cecil | |
| 2020/0050099 A1* | 2/2020 | Su | G06T 7/60 |
| 2020/0356011 A1 | 11/2020 | Su et al. | |
| 2021/0357566 A1* | 11/2021 | Simmons | G06F 30/392 |
| 2021/0374936 A1 | 12/2021 | Koopman et al. | |
| 2022/0179321 A1* | 6/2022 | Ma | G03F 7/70625 |
| 2022/0284344 A1* | 9/2022 | Ma | G06N 3/082 |
| 2022/0335333 A1* | 10/2022 | Cao | G06N 3/047 |

FOREIGN PATENT DOCUMENTS

| | | |
|---|---|---|
| CN | 110476159 | 11/2019 |
| CN | 110692017 | 1/2020 |
| KR | 10-2005-0002615 | 1/2005 |
| TW | 201214026 | 4/2012 |
| TW | 201901285 | 1/2019 |
| TW | 201921151 | 6/2019 |
| TW | 201939365 | 10/2019 |
| TW | 201942769 | 11/2019 |
| WO | 2019048506 | 3/2019 |
| WO | 2019162346 | 8/2019 |

OTHER PUBLICATIONS

K.K.Kohli et al., "Automated detection and classification of printing sub-resolution assist features using machine learning algorithms," Optical Microlithography XXX, Proc. of SPIE vol. 10147, 2017, 7 pages. (Year: 2017).*
M. Jeong et al., Pixel-based learning method for an optimized photomask in optical lithography, J. Micro/Nanolith. MEMS MOEMS 16(4), Oct.-Dec. 2017, 12 pages. (Year: 2017).*
S. Wang et al., "Machine learning assisted SRAF placement for full chip," Photomask Technology 2017, Proc. of SPIE 10451, 7 pages. (Year: 2017).*
Y. Lin et al., "Machine Learning for Mask/Wafer Hotspot Detection and Mask Synthesis," Photomask Technology 2017, Proc. of SPIE 10451, 13 pages. (Year: 2017).*
S. Lan et al., Deep learning assisted fast mask optimization, Optical Microlithography XXXI, Proc. of SPIE vol. 10587, 2018, 16 pages. (Year: 2018).*
S. Wang et al., "Efficient full-chip SRAF placement using Machine Learning for best accuracy and improved consistency," Optical Microlithography XXXI, Proc. of SPIE vol. 10587, 2018, 9 pages. (Year: 2018).*
M. Guajardo et al., "Investigation of machine learning for dual OPC and assist feature printing optimization," Design-Process-Technology Co-optimization for Manufacturability XIII, Proc. of SPIE vol. 10962, 2019, 10 pages. (Year: 2019).*
International Search Report and Written Opinion issued in corresponding PCT Patent Application No. PCT/EP2021/053569, dated May 21, 2021.
Taiwanese Office Action issued in corresponding Taiwanese Patent Application No. 110107274, dated Apr. 12, 2022.
Geng, H. et al.: "SRAF Insertion via Supervised Dictionary Learning", *IEEE Transactions on Computer-Aided Design of Integrated Circuits and Systems*, vol. 39, No. 10, pp. 2849-2859 (Sep. 24, 2019).
Office Action issued in corresponding Chinese Patent Application No. 202180017644.X, dated Nov. 13, 2024.
B.Y. Yu et al., "Deep Learning-Based Framework for Comprehensive Mask Optimization", Association for Computing Machinery '19, Tokyo, Japan, pp. 1-6 (2019).
Office Action issued in Taiwanese Patent Application No. 111139025, dated Mar. 8, 2023.

* cited by examiner

MACHINE LEARNING BASED SUBRESOLUTION ASSIST FEATURE PLACEMENT

CROSS-REFERENCE TO RELATED APPLICATIONS

This application is the U.S. national phase entry of PCT Patent Application No. PCT/EP2021/053569 which was filed on Feb. 12, 2021, which claims priority of U.S. Provisional Application No. 62/984,396 which was filed on Mar. 3, 2020 and which is incorporated herein in its entirety by reference.

TECHNICAL FIELD

The description herein relates generally to patterning process, and more particularly, apparatuses, methods, and computer program products for using machine learning for placement of subresolution assist features in characteristic patterns corresponding to a design layout.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involve processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

The term "projection optics," as used herein, should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

A method for training a machine learning model to generate a characteristic pattern includes obtaining training data associated with a reference feature in a reference image, wherein the training data includes (i) location data of each portion of a plurality of portions of the reference feature, and (ii) a presence value indicating whether the portion of the reference feature is located within a reference assist feature generated for the reference feature; and training, based on the training data associated with the reference feature, the machine learning model such that a metric between a predicted presence value and the presence value is minimized.

In some embodiments, the characteristic pattern is used for manufacturing a mask pattern, which is further used for printing a target pattern on a substrate.

In some embodiments, the reference image is a continuous transmission mask (CTM) image generated by simulating an optical proximity correction process using the target pattern, and the reference feature corresponds to a target feature from the target pattern.

In some embodiments, the reference assist feature includes sub-resolution assist features placed around the reference feature, and the sub-resolution assist features are rectilinear in shape.

In some embodiments, the training data includes training data for a plurality of reference features in one or more reference images.

Furthermore, the method of training the machine learning model includes (a) executing, the machine learning model using the training data, to output the predicted presence value associated with the corresponding portion of the reference feature; (b) determining the metric between the predicted presence value and the presence value; (c) adjusting the machine learning model such that the cost function is reduced; (d) determining whether the metric is minimized; and (e) responsive to not minimized, performing steps (a), (b), (c), and (d).

In some embodiments, the method further includes obtaining a specified reference image; and determining, via executing the machine learning model using the specified reference image, a preferred assist feature for placement in relation to a specified feature of the specified reference image, wherein the specified feature corresponds to a target feature of a target pattern to be printed on the substrate.

In some embodiments, determining the preferred assist feature includes obtaining, from the specified reference image and using an intensity threshold, a specified contour of the specified feature, generating a skeleton of the specified contour, inputting location data and distance data to the machine learning model, wherein the location data includes coordinates of a set of points on the skeleton, wherein the distance data indicates a closest distance from a point of the set of points to the specified contour, and obtaining, from the machine learning model, a predicted presence value for each point of the set of points, wherein the predicted presence value indicates whether the corresponding point is predicted to be located within the preferred assist feature, wherein the set of points includes (a) a covered set of points that is predicted to located within the preferred assist feature, and (b) an uncovered set of points that is predicted not to be located within the preferred assist feature.

In some embodiments, the method of determining the preferred assist feature further includes generating a plurality of assist feature sets to cover points from the covered set of points, determining a reward value for each assist feature set using a scoring function, and determining a first assist feature set of the assist feature sets having a highest reward value as the preferred assist feature for placement in relation to the specified contour.

In some embodiments, the method of determining the reward value for each assist feature set includes (i) selecting a point from the uncovered set of points as a cut-off point, wherein the cut-off point divides the skeleton into a plurality of segments, (ii) generating an assist feature set of the plurality of assist feature sets having a candidate assist feature for each segment of the plurality of segments, wherein the candidate assist feature is generated based on (a) the distance data associated with each point of the set of points, and (b) a set of constraints the candidate assist feature has to satisfy for manufacturing of the mask pattern, (iii) determining a reward value associated with the assist feature set as a function of (a) image intensity value within the assist feature set, and (b) the intensity threshold, and iterating through steps (i), (ii) and (iii) by selecting a different cut-off point from the uncovered set of points, generating another assist feature set, and determining their corresponding reward value.

In some embodiments, the distance value indicates a closest distance from a point to the specified contour.

In some embodiments, the method further includes generating a characteristic pattern with the preferred assist feature, wherein the characteristic pattern is a pixelated image that includes the preferred assist feature placed in relation to the specified feature.

In some embodiments, the method of generating the characteristic pattern includes generating the characteristic pattern with a plurality of preferred assist features, wherein the preferred assist features are placed in relation to a plurality of reference features of the specified reference image, wherein the preferred assist features are determined by executing the machine learning model for the reference features.

In some embodiments, the method of generating the characteristic pattern includes adjusting the placement of the preferred assist features further based on a set of constraints related to manufacturing of the mask pattern.

In some embodiments, the machine learning model is a sequence labeling model.

In some embodiments, the sequence labeling model includes a Bidirectional Long Short-term Memory (BiLSTM) network.

Furthermore, in some embodiments, obtaining the training data includes generating a plurality of assist feature sets for the reference feature based on a set of constraints for manufacturing of a mask pattern, wherein each assist feature set is associated with a reward value that is determined based on a specified scoring function, determining a specified assist feature set of the plurality of assist feature sets associated with a highest reward value as the reference assist feature, determining a status value for each portion of the reference feature as a function of the reward value of the plurality of assist feature sets and a number of assist feature sets in which the corresponding portion is determined to be located within, and generating the location data and the presence value of the training data for each portion of the reference feature, wherein the presence value is set to a first value if the status value of the corresponding portion satisfies a status threshold, the first value indicating that the corresponding portion is located within the reference assist feature.

In some embodiments, the method of generating the presence value includes setting the presence value to a second value if the status value of the corresponding portion does not satisfy the status threshold, the second value indicating that the corresponding portion is not located within the reference assist feature.

In some embodiments, the method of generating the plurality of assist feature sets includes generating a skeleton of the reference feature; selecting a plurality of cut-off points on the skeleton, wherein each cut-off point segments the skeleton into a plurality of segments; and for each cut-off point, generating an assist feature set having a reference assist feature for each segment of the plurality of segments, wherein the assist feature set is generated based on the set of constraints and a distance value associated with each point of a set of points on the skeleton.

In some embodiments, the method of determining the assist feature set having the highest reward value includes determining, using the specified scoring function, the reward value of an assist feature set of the plurality of assist feature sets as a function of (a) image intensity value within the assist feature set, and (b) an intensity threshold.

In some embodiments, the intensity threshold is used to generate a contour of the reference feature, wherein the contour is used to generate the skeleton of the reference feature.

In some embodiments, the method of determining the status value for each portion of the reference feature includes determining the status value for each point on the skeleton.

In some embodiments, the method further includes determining the status threshold as a function of a maximum and/or minimum of the status values of the set of points on the skeleton.

In some embodiments, the method of generating the training data for each portion of the reference feature includes generating the location data and the presence value for each point on the skeleton of the reference feature.

In a related aspect, a method for generating a characteristic pattern includes obtaining a contour of a reference feature from a reference image; executing, by a hardware computer system and using the contour, a machine learning model for determining a preferred assist feature set to be placed around the contour, and wherein the preferred assist feature set has a reward value that is highest among reward values of a plurality of assist feature sets, and wherein the reward value is calculated as a function of an intensity threshold used to generate the contour; and generating the characteristic pattern with the contour and the preferred assist feature set.

In some embodiments, the characteristic pattern is used for manufacturing a mask pattern that is used for printing a target pattern on a substrate.

In some embodiments, the reference image is a CTM image.

In some embodiments, the method of executing the machine learning model to determine the preferred assist feature set includes generating a skeleton of the contour, wherein the skeleton includes a set of points; selecting a plurality of cut-off points on the skeleton, wherein each cut-off point segments the skeleton into a plurality of segments; and for each cut-off point, generating an assist feature set of the plurality of assist feature sets for each segment of the plurality of segments, wherein the assist feature set is generated based on a set of constraints and a distance value associated with each point on the skeleton.

In some embodiments, the method further includes determining the reward value of an assist feature set as a function of (a) intensity value associated with each point of the skeleton that is located within the assist feature set, and (b) the intensity threshold; and selecting one of the assist feature sets having a highest reward value as the preferred assist feature set.

In some embodiments, the method further includes generating, using the preferred assist feature set, training data for training a second machine learning model to generate second characteristic pattern based a second reference image.

In some embodiments, the training data includes training data for a plurality of preferred assist feature sets generated for a plurality of contours from the reference image.

In some embodiments, the method of generating the training data includes generating coordinates of each point of the skeleton of the contour; and generating a presence value associated with each point of the skeleton, wherein the presence value indicates whether the corresponding point is located within the preferred assist feature set.

In some embodiments, the method of generating the coordinates of each point includes generating coordinates of a pixel corresponding to the point in the reference image.

In some embodiments, the method of generating the presence value includes determining a status value for each point of the skeleton as a function of the reward value of the plurality of assist feature sets and a number of assist feature sets in which the corresponding point is determined to be located within; determining a status threshold as a function of maximum status value and a minimum status value of the set of points of the skeleton; and generating the presence value for each point of the skeleton, wherein the presence value is set to a first value if the status value of the corresponding point satisfies the status threshold, the first value indicating that the corresponding point is located within the preferred assist feature set.

In some embodiments, the method further includes training, based on the training data, the second machine learning model such that a cost function that determines a difference between a predicted presence value and the presence value is minimized.

In a related aspect, a method for generating a characteristic pattern for a mask pattern includes obtaining a reference image having reference features; obtaining a contour of a reference feature of the reference features from the reference image; generating a skeleton of the contour; determining, via executing a machine learning model using the skeleton, a presence value indicating whether each point of a set of points on the skeleton is located within a preferred assist feature set to be generated for placement around the reference feature; and generating a characteristic pattern using the presence value.

In some embodiments, the characteristic pattern is a pixelated image that includes the preferred assist feature set placed in relation to the contour.

In some embodiments, the set of points includes (a) a covered set of points that is predicted to located within the preferred assist feature set, and (b) an uncovered set of points that is predicted not to be located within the preferred assist feature set.

In some embodiments, the method of generating the characteristic pattern using the presence value includes (i) selecting a point from the uncovered set of points as a cut-off point, wherein the cut-off point divides the skeleton into a plurality of segments; (ii) generating a first assist feature set having an assist feature for each segment of the plurality of segments, wherein the assist feature is generated based on (a) a distance value associated with each point of the set of points, and (b) a set of constraints the assist feature has to satisfy for manufacturing of the mask pattern; (iii) determining a reward value associated with the first assist feature set as a function of (a) intensity value associated with each point of the set of points located within the first assist feature set, and (b) an intensity threshold that is used in obtaining the contour; iterating through steps (i), (ii) and (iii) by selecting a different cut-off point from the uncovered set of points, generating another assist feature set, and determining their corresponding reward value; and determining one of the assist feature sets that has a highest reward value as the preferred assist feature set for placement in relation to the reference feature.

In some embodiments, the method of generating the first assist feature set includes performing a random perturbation on the first assist feature set and applying the set of constraints to the first assist feature set.

In some embodiments, the method of generating the characteristic pattern includes generating the characteristic pattern with a plurality of preferred assist feature sets for placement in relation to a plurality of reference features from the reference image.

In some embodiments, the reference image is a CTM image.

According to an embodiment, there is provided a computer program product comprising a non-transitory computer readable medium having instructions recorded thereon. The instructions, when executed by a computer, implement the methods listed in the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed embodiments. In the drawings.

DETAILED DESCRIPTION

Figure 1:
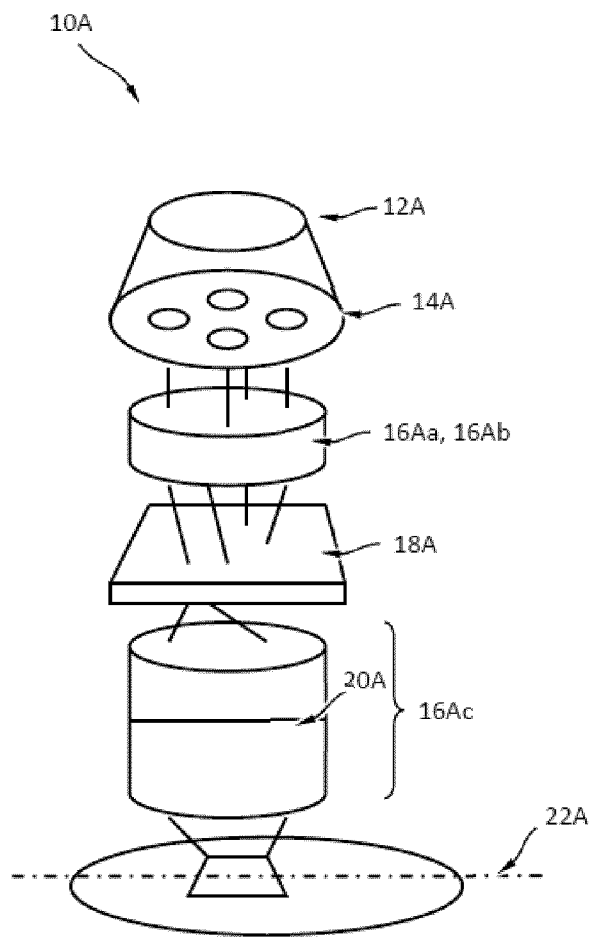
FIG. 1 illustrates a block diagram of various subsystems of a lithographic projection apparatus, according to an embodiment.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

An example of a programmable LCD array is given in U.S. Pat. No. 5,229,872, which is incorporated herein by reference.

FIG. 1 illustrates a block diagram of various subsystems of a lithographic projection apparatus 10A, according to an embodiment. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin(Θmax), wherein n is the refractive index of the media between the substrate and the last element of the projection optics, and Θmax is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, where each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

According to an embodiment of the present disclosure, one or more images may be generated. The images includes various types of signal that may be characterized by pixel values or intensity values of each pixel. Depending on the relative values of the pixel within the image, the signal may be referred as, for example, a weak signal or a strong signal, as may be understood by a person of ordinary skill in the art. The term "strong" and "weak" are relative terms based on intensity values of pixels within an image and specific values of intensity may not limit scope of the present disclosure. In an embodiment, the strong and weak signal may be identified based on a selected threshold value. In an embodiment, the threshold value may be fixed (e.g., a midpoint of a highest intensity and a lowest intensity of pixel within the image. In an embodiment, a strong signal may refer to a signal with values greater than or equal to an average signal value across the image and a weak signal may refer to signal with values less than the average signal value. In an embodiment, the relative intensity value may be based on percentage. For example, the weak signal may be signal having intensity less than 50% of the highest intensity of the pixel (e.g., pixels corresponding to target pattern may be considered pixels with highest intensity) within the image. Furthermore, each pixel within an image may considered as a variable. According to the present embodiment, derivatives or partial derivative may be determined with respect to each pixel within the image and the values of each pixel may be determined or modified according to a cost function-based evaluation and/or gradient based computation of the cost function. For example, a CTM image may include pixels, where each pixel is a variable that can take any real value.

Figure 2:
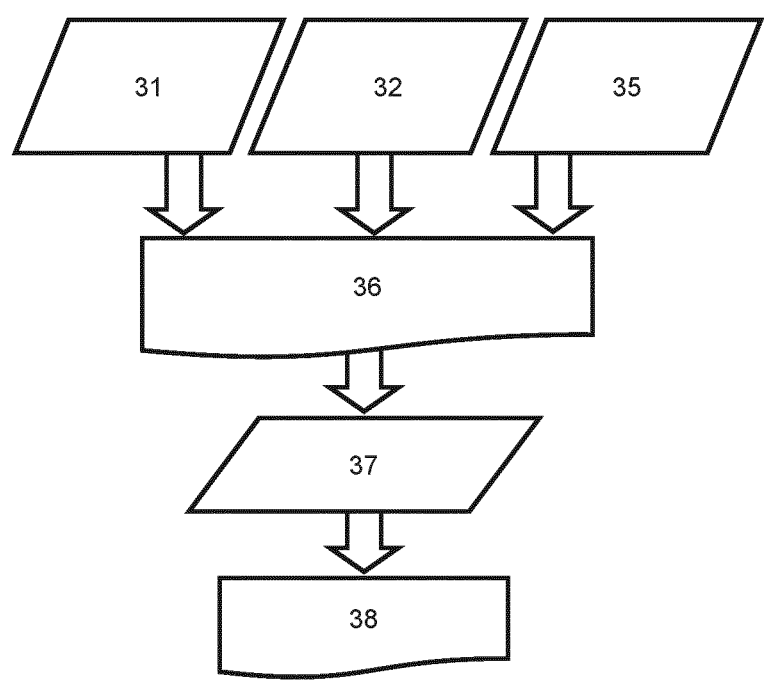
FIG. 2 illustrates an exemplary flow chart for simulating lithography in a lithographic projection apparatus, according to an embodiment.

FIG. 2 illustrates an exemplary flow chart for simulating lithography in a lithographic projection apparatus, according to an embodiment. Source model 31 represents optical characteristics (including radiation intensity distribution and/or phase distribution) of the source. Projection optics model 32 represents optical characteristics (including changes to the radiation intensity distribution and/or the phase distribution caused by the projection optics) of the projection optics. Design layout model 35 represents optical characteristics of a design layout (including changes to the radiation intensity distribution and/or the phase distribution caused by design layout), which is the representation of an arrangement of features on or formed by a patterning device. Aerial image 36 can be simulated from design layout model 35, projection optics model 32, and design layout model 35. Resist image 38 can be simulated from aerial image 36 using resist model 37. Simulation of lithography can, for example, predict contours and CDs in the resist image.

More specifically, it is noted that source model 31 can represent the optical characteristics of the source that include, but not limited to, numerical aperture settings, illumination sigma ($\sigma$) settings as well as any particular illumination shape (e.g. off-axis radiation sources such as annular, quadrupole, dipole, etc.). Projection optics model 32 can represent the optical characteristics of the projection optics, including aberration, distortion, one or more refractive indexes, one or more physical sizes, one or more physical dimensions, etc. Design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another embodiment, an initial larger set of clips may be extracted from the entire design layout by using some kind of automated (such as machine vision) or manual algorithm that identifies the one or more critical feature areas.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N) \quad \text{(Eq. 1)}$$

where $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic for a set of values of the design variables of $(z_1, z_2, \ldots, z_N)$. $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. $f_p(z_1, z_2, \ldots, z_N)$ can also be a function of an interlayer characteristic, which is in turn a function of the design variables ($z_1, z_2, \ldots, z_N$). Of course, $CF(z_1, z_2, \ldots, z_N)$ is not limited to the form in Eq. 1. $CF(z_1, z_2, \ldots, z_N)$ can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, an interlayer characteristic, or a combination thereof. In one embodiment, the design variables ($z_1, Z_2, \ldots, z_N$) comprise one or more selected from dose, global bias of the patterning device, and/or shape of illumination. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$. The design variables can include any adjustable parameter such as an adjustable parameter of the source, the patterning device, the projection optics, dose, focus, etc.

The lithographic apparatus may include components collectively called a "wavefront manipulator" that can be used to adjust the shape of a wavefront and intensity distribution and/or phase shift of a radiation beam. In an embodiment, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the characteristics represented by the cost function. Such changes can be simulated from a model or actually measured. The design variables can include parameters of the wavefront manipulator.

The design variables may have constraints, which can be expressed as $(z_1, Z_2, \ldots, z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

As used herein, the term "patterning process" generally means a process that creates an etched substrate by the application of specified patterns of light as part of a lithography process. However, "patterning process" can also include plasma etching, as many of the features described herein can provide benefits to forming printed patterns using plasma processing.

As used herein, the term "target pattern" means an idealized pattern that is to be etched on a substrate.

As used herein, the term "printed pattern" means the physical pattern on a substrate that was etched based on a target pattern. The printed pattern can include, for example, troughs, channels, depressions, edges, or other two and three dimensional features resulting from a lithography process.

As used herein, the term "process model" means a model that includes one or more models that simulate a patterning process. For example, a process model can include an optical model (e.g., that models a lens system/projection system used to deliver light in a lithography process and may include modelling the final optical image of light that goes onto a photoresist), a resist model (e.g., that models physical effects of the resist, such as chemical effects due to the light), and an OPC model (e.g., that can be used to make target patterns and may include scattering bars (SBARs) (also called as sub-resolution resist features (SRAFs)), etc.). As used herein, the term "calibrating" means to modify (e.g., improve or tune) and/or validate something, such as the process model.

In order to print a target pattern almost every feature of a design layout of the target pattern has some modification so that a high fidelity of a projected image on the substrate to the target pattern is achieved. These modifications may include shifting or biasing of edge positions or line widths as well as application of "assist" features that are intended to assist projection of other features. The modified design layout is then used to manufacture a patterning device (e.g., a mask). A mask manufacturing has limitations related to a size, shape and positioning of the features (e.g., assist features and main features). Hence, the modified design layout should be modified with certain manufacturing limitations in mind as well.

Currently, one of the most accurate mask design methods for generating assist features such as SRAFs is the CTM method. The CTM method first designs a grayscale mask, referred to as a continuous transmission map, or CTM. The method involves optimization of grey scale values using a gradient descent, or other optimization methods so that a performance metric (e.g., edge placement error (EPE)) of a lithographic apparatus is improved. However, the CTM cannot be manufactured as a mask itself, since it is a grayscale mask with unmanufacturable features. The CTM is nonetheless viewed as an ideal model which is the basis for a manufacturable mask. After the CTM is optimized, a mask design process proceeds to a bar extraction process. An example CTM optimization process is discussed in detail in U.S. patent publication US20170038692A1, which is incorporated herein in its entirety by reference, that describes different flows of optimization for lithographic processes.

In the bar extraction process, the CTM is used to guide the placement of SRAFs. In an embodiment, the SRAFs may be curved, rectangular or other geometric shape, where the shape is easy to manufacture, e.g., with e-beam lithography. After the bar extraction process, an edge-based OPC is conducted on the main features (e.g., a target feature of a target pattern to be printed on the substrate) of the design layout. In the edge-based OPC, edges of the main features are adjusted to ensure accurate printing of the target pattern on the substrate.

Current SRAF placement is based on a reference image (e.g., a CTM), and the method includes: (a), deriving ridge lines on the reference image, (b) placing SRAFs along the ridge lines, and (c) applying mask rule check (MRC) constraints on the SRAFs. According to the definition of ridge, the generated ridge lines are sensitive to local intensity maximum or minimum, and many ridge lines may cross same point. Thus, the ridge-based SRAFs overlap a lot before applying MRC. The MRC cleanup step becomes computationally intensive in performing the clean-up. When the final SRAF is rasterized, the resulting image will be very different from the original reference image the SRAF extraction is applied on.

The current bar extraction methods may use heuristics to guide a desired placement and size of SRAFs. These heuristics may not be accurate, and computationally intensive. The existing methods for SRAF generation may rely on inexact heuristics that often have sub-optimal results, e.g., in terms of process window or consistency. For example, sometimes vertical bars are placed where horizontal bars would be more natural and work better, or vice versa. When these sub-optimal SRAFs are included in a mask pattern, which is further used in a lithographic apparatus, the resulting performance of the patterning process may not meet a desired performance criterion.

The methods of the present disclosure seek to optimize determination of SRAF placements in generating a characteristic pattern. In some embodiments, the result will be a mask that is close to a CTM as well as easy to manufacture.

The methods (e.g., related to FIGS. 6 and 8-10, including method 1000) described herein train a machine learning model to determine a placement of SRAFs in generating a characteristic pattern. In some embodiments, the characteristic pattern is an extraction friendly map or image that includes features that are easy to extract. As an example, the characteristic pattern includes SRAFs and/or main features, which correspond to target features of a target pattern to be printed on the substrate. The SRAFs may be rectilinear in shape. In another example, an SRAF may include a curved feature.

In an embodiment, the placement of the SRAFs in the characteristic pattern is determined from a machine learning model trained to closely follow a reference image (e.g., the CTM) as well as design rules related to manufacturing of the mask pattern. In an embodiment, a mask manufactured using the characteristic pattern will improve a performance of the patterning process (e.g., a process window). For example, a lithographic apparatus can employ the mask for printing patterns on a substrate. Such printed pattern will have minimum errors or result in high yield of the patterning process. In some embodiments, process window is a collection of values of process parameters that allow circuit to be manufactured and to operate under desired specifications. For instance, as an example, lithographic process window is typically defined as the set of {focus, exposure} points to control CD variation to within a specified range.

In an embodiment, design rules used herein refer to limitation related to manufacturing of the mask, for example, mask rule check (MRC) constraints. In the present disclosure, the design rules herein may be different from design rules (e.g., minimum CD, minimum pitch) associated with a design layout e.g., target patterns that need to be printed on a substrate. For mask patterns, the design rules do not necessarily follow design rules related to the design layout. For example, SRAFs can be small and also violate minimum pitch requirement.

In an embodiment, for example, MRC may include parameters such as a relative position of a feature (e.g., SRAFs) with respect to neighboring features, a position of an SRAF with respect to main feature or other SRAFs, a shape and size of a feature, or a combination thereof. For example, the MRC constraint can be a feature having a rectilinear shape, a curved shape having a radius of curvature within a specified range, or a combination thereof. In an embodiment, the design rules may be defined based on heuristics e.g., a user-experience and past printing performance. The methods apply the MRC constraints in generating the characteristic pattern.

Figure 3:
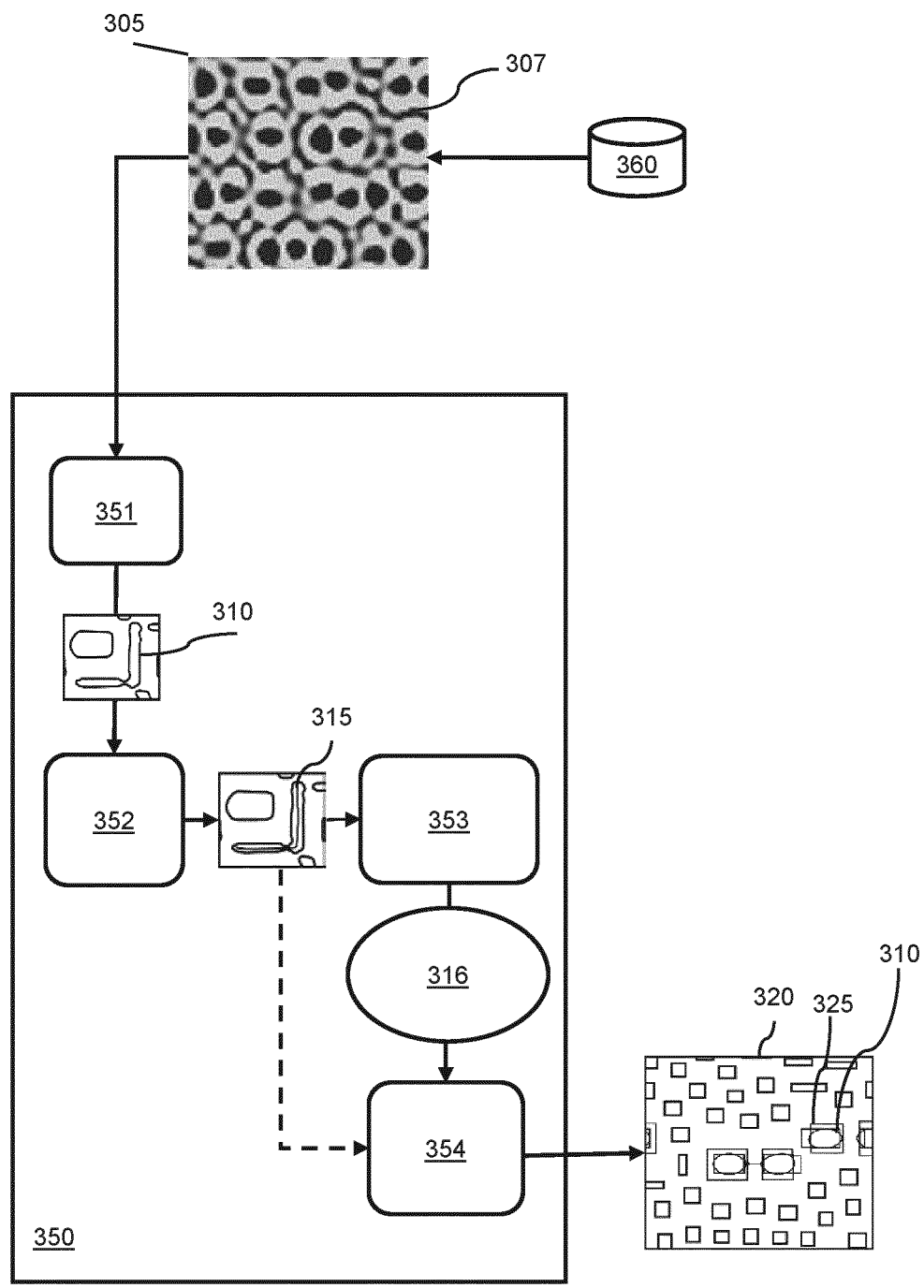
FIG. 3 shows a block diagram for generating a characteristic pattern from a reference image, consistent with various embodiments.

FIG. 3 shows a block diagram for generating a characteristic pattern from a reference image, consistent with various embodiments. A generator module 350 accepts as input a reference image 305 and generates a characteristic pattern 320 based on the reference image 305. The characteristic pattern is used in manufacturing a mask pattern that may be used in printing a target pattern on a substrate. In some embodiments, the reference image 305 is an image, such as a CTM or a mask image, having features (e.g., main feature such as reference feature 307). The main features correspond to target features of a target pattern to be printed on the substrate. In some embodiments, the CTM is generated by performing one or more OPC related process on the target pattern. In some embodiments, the mask image may be predicted using ML methods or generated using other known methods. The reference image 305 may be stored in a database 360. The database 360 can also store other information such as the characteristic pattern 320 and any other data necessary to generate the characteristic pattern 320.

In some embodiments the characteristic pattern 320 is an image that includes main features and SRAFs in which the SRAFs are placed near the main features. For example, the characteristic pattern 320 includes contours of the main features (e.g., contour 310 of the reference feature 307) and a preferred SRAF set 325 having one or more SRAFs placed near the contour 310. In some embodiments, the characteristic pattern 320 is similar to the reference image 305 but is more extraction friendly than the reference image 305 as the features from characteristic pattern 320 are easy to extract, and a mask pattern manufactured using such an image improves the pattering process by minimizing the number of errors and/or improving a process window in printing the target pattern on a substrate. In some embodiments, the characteristic pattern may be an image composed exclusively of rectangles that represents an optimized mask design.

The generator module 350 can implement the methods in several different computation or training flows (e.g., method 900 of FIG. 9A and 1100 of FIG. 11A) to generate the characteristic pattern 320. Each of these flows takes, as an input, a reference image 305 (e.g., a CTM, CTM+, or a machine learning (ML) predicted mask image (MI)). In the case of the CTM as input, the CTM may have already been optimized to print the desired pattern. The output for each method is the characteristic pattern 320.

As an example, in a first method, an ML model such as reinforcement learning (RL) method may be used in determining the characteristic pattern 320. In some embodiments, reinforcement learning is an area of machine learning concerned with how software agents ought to take actions in an environment in order to maximize some notion of cumulative reward. Reinforcement learning is one of different types of basic machine learning paradigms, alongside supervised learning and unsupervised learning. RL differs from supervised learning in not needing labelled input/output pairs be presented, and in not needing sub-optimal actions to be explicitly corrected. Instead the focus is on finding a balance between exploration (of uncharted territory) and exploitation (of current knowledge). RL collects information by interacting with the system and getting a reward. In the RL method, an SRAF generator model 354 in the generator module 350 may obtain a skeleton 315 of a contour 310, determine a status value for each point in the skeleton 315 (referred to as "skeleton point"), select cut-off points on the skeleton 315 (e.g., randomly) to generate multiple segments of the skeleton 315 based on the cut-off points, place an SRAF for at least some of the segments to create a SRAF set, and calculate reward for the SRAF set. The above process (among other processes that will be described in the later paragraphs) can be repeated for various cut-off points to generate various SRAF sets, and an SRAF set with a reward value satisfying a criterion (e.g., SRAF set with the highest reward value) is chosen as a preferred SRAF set. Similarly, a preferred SRAF set is determined for each contour extracted from the reference image 305 and then a characteristic pattern 320 with the SRAFs placed based on the preferred SRAF sets is generated. In some embodiments, the RL method can be implemented using Monte Carlo method, which uses randomness for deterministic problems difficult to solve using other approaches. Additional details of the RL method are described at least with reference to FIGS. 6, 9A and 9B.

While the RL method determines the best placement of SRAFs, the RL method may have to be repeated for each of the contours as there is no learning from one contour that may be used to generate a preferred SRAF set for another contour. Accordingly, in some embodiments, in a second method, an ML model may be trained using supervised learning to generate the characteristic pattern 320 (e.g., FIGS. 9 and 10).

As an example, the supervised learning method uses a neural network that is trained on SRAF placement data associated with a set of reference images that is generated using one or more methods, including existing methods or other ML based methods such as the RL method described above. Once trained, a reference image can be inserted as the input, and the trained machine learning model generates a characteristic pattern. For example, from the preferred SRAF sets generated using the RL method, labeled SRAF placement data is created for each skeleton 315, which contains information such as whether each skeleton point is covered by (e.g., lies in or located within) the preferred SRAF set of that contour and skeleton distance information of the skeleton point (e.g., a least distance from the skeleton point to the contour). Such labeled data created for a number of skeletons (e.g., of contours from one or more reference images) is used as training data to train an ML model (e.g., SRAF placement model 353) to predict whether, for an input skeleton, each skeleton point is to be covered by an SRAF set or not. The predicted data (also referred to as "SRF placement data"), which contains information about which skeleton points are to be covered by an SRAF set and which should not be are then used to generate the preferred SRAF set for the contour corresponding to the input skeleton (e.g., using SRAF generator model 354 as described above). In some embodiments, the supervised ML model includes a sequence labeling model, such as a Bidirectional Long Short-term Memory (BiLSTM) neural network. The sequence labeling model can also be implemented using other ML models, such as convolutional neural network (CNN), a recurrent neural network (RNN), Conditional Random Field (CRF), or other ML models. Additional details with respect to the supervised learning method are described at least with reference to FIGS. 7, 8, 10 and 11.

Figure 4:
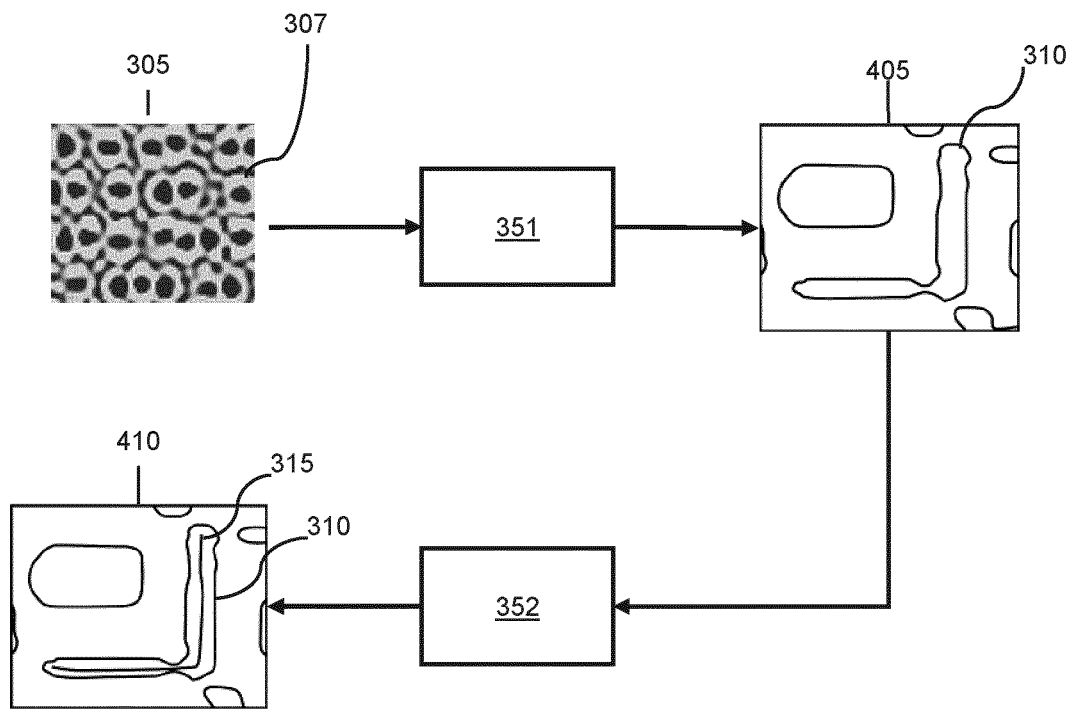
FIG. 4 is a block diagram for generating a contour and skeleton for a feature, consistent with various embodiments.

FIG. 4 is a block diagram for generating a contour and skeleton for a feature, consistent with various embodiments. The reference image 305 is input to a contour extractor 351, which extracts contours of the features from the reference image 305, to generate a contour image 405. The contour image 405 includes the contours, such as the contour 310, for various features. The contour extractor 351 can extract the contour 310 from the reference image 305 using one of many image analysis techniques. For example, the contour extractor 351 can extract the contour 310 based on a change in intensity of pixels in the reference image 305. A change in intensity, gradient, and the like, of pixels in an image can identify an edge (e.g., contour). For example, when the reference image 305 is expressed as a greyscale image, when the change exceeds a greyscale threshold (e.g., an intensity above or below a defined value), this can identify an edge (i.e. contour 310). In some embodiments, the contour extractor 351 uses a specified intensity threshold to extract the contours, such as the contour 310.

The contour image 405 is input to a skeletonizer 352 to generate a skeletonized representation 410, which includes a skeleton for each contour from the contour image 405. As an example, the skeletonized representation 410 includes a skeleton 315 for the contour 310. In shape analysis, skeleton (or topological skeleton) of a shape is a thin version of that shape that is equidistant to its boundaries. The skeleton usually emphasizes geometrical and topological properties of the shape, such as its topology, length, direction, and width. Together with the distance of its points (e.g., skeleton distance) to the shape boundary, the skeleton can also serve as a representation of the shape (they contain all the information necessary to reconstruct the shape). In some embodiments, a skeleton is one-pixel wide representation of a binary object in an image, and can be generated using one of many skeletonization methods. In some embodiments, skeletonization techniques include (a) detecting ridges in distance map of the boundary points, (b) calculating the Voronoi diagram generated by the boundary points, and (c) the layer by layer erosion called thinning.

Figure 5:
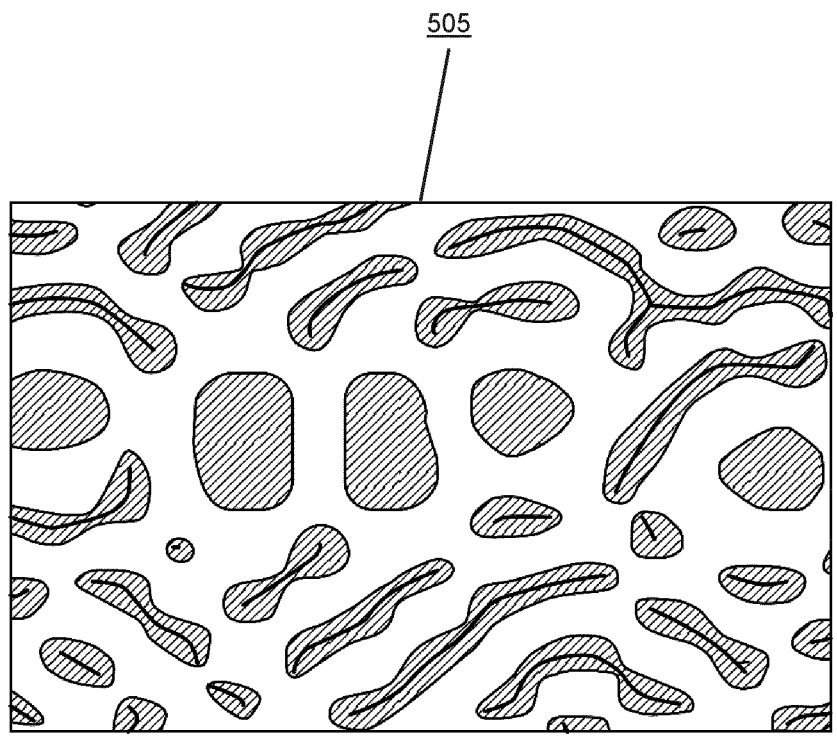
FIG. 5 shows another skeletonized representation of contours, consistent with various embodiments.

The skeleton 315 is made up of a number of points (referred to as "skeleton points"). Each skeleton point is associated with (a) location data, such as co-ordinates of the skeleton point in the skeletonized representation 410, and (b) a skeleton distance, which is the least distance from the skeleton point to the contour. While a skeletonized representation includes skeletons of a number of contours from the reference image 305, a skeleton 315 for only one contour is shown in the skeletonized representation 410 for the sake of simplicity. FIG. 5 shows another skeletonized representation of contours, consistent with various embodiments. The skeletonized representation 505 includes a number of contours and their skeletons.

Figure 6:
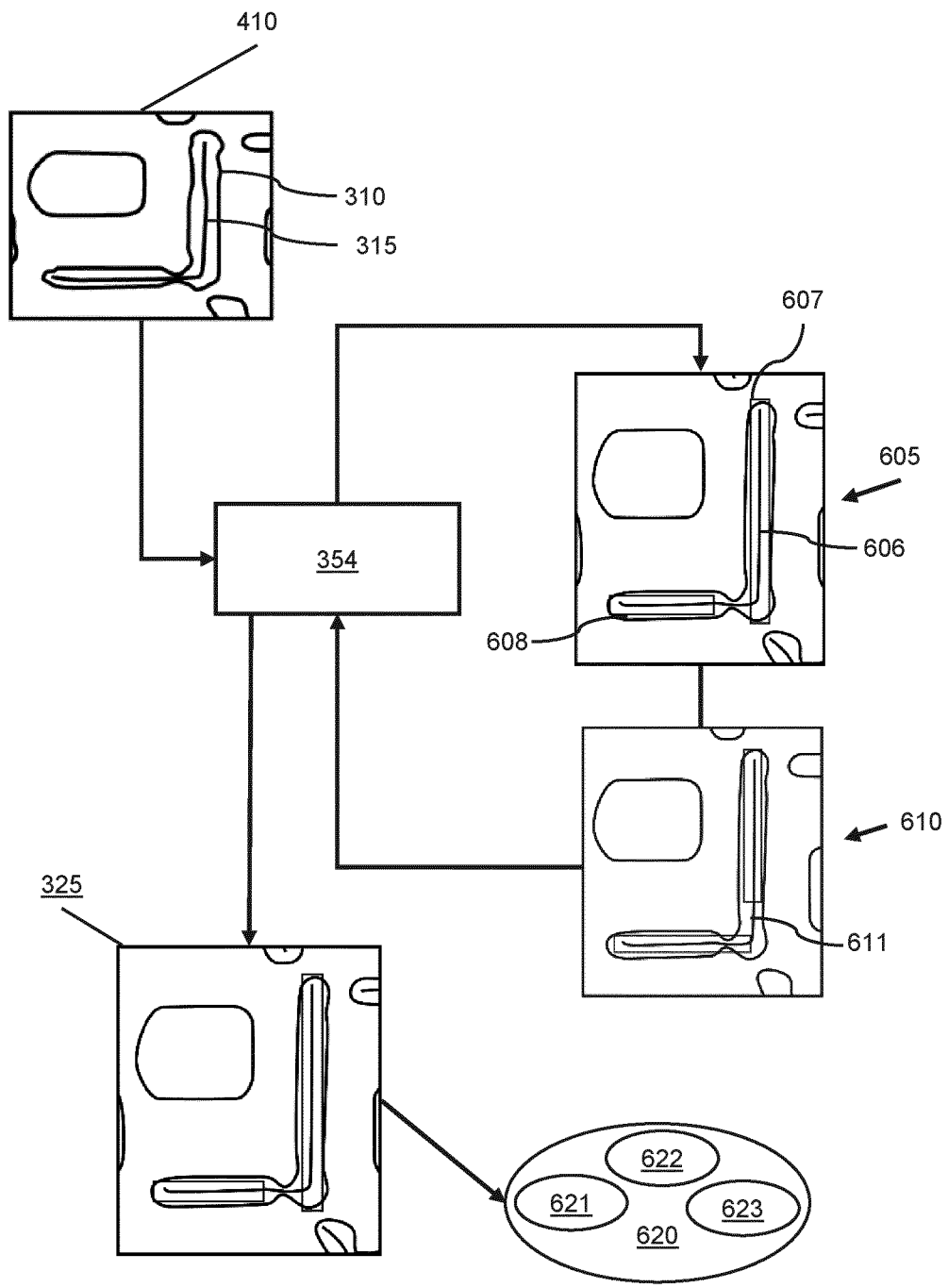
FIG. 6 is a block diagram for generation of a preferred subresolution assist feature (SRAF) set for a contour, consistent with various embodiments.

FIG. 6 is a block diagram for generation of a preferred SRAF set for a contour, consistent with various embodiments. In some embodiments, the SRAF generator model 354 uses the RL method (e.g., Monte Carlo method) to determine a preferred SRAF set 325 for the contour 310. The following paragraphs describe the SRAF generator model 354 determining the preferred SRAF set 325 with reference to one contour, e.g., contour 310. However, the SRAF generator model 354 may perform the same for other contours (e.g., each contour in the skeletonized representation 410) to determine a preferred SRAF set for the other contours in the skeletonized representation 410.

The skeletonized representation 410 is input to the SRAF generator model 354 and the SRAF generator model 354 processes the skeleton 315 to determine the preferred SRAF set 325 for the contour 310. The SRAF generator model assigns the following values to each of the skeleton points on the skeleton 315. These values are initialized to "0."

R(i): Total Reward
N(i): Total Covered Times
S(i): Status Value

The SRAF generator model 354 selects one or more cut-off points on the skeleton 315 that divides the skeleton 315 into two or more segments, and determines an SRAF for each segment using the skeleton distance and MRC constraints, thus generating an SRAF set having multiple SRAFs. For example, a first cut-off point 606 is selected, which divides the skeleton 315 into two segments, and an SRAF is generated for each of the segments, e.g., a first SRAF 607 and a second SRAF 608, forming a first SRAF set 605.

The SRAF generator model 354 then performs a random perturbation process and an MRC clean process on the first SRAF set 605 to make the first SRAF set 605 compliant with manufacturing standards of a mask pattern. In some embodiments, random perturbation is a process that slightly offsets the image, or mirrors the image horizontally or vertically. One of the reasons random perturbation is performed is to reduce overfitting the ML model. As described above, the MRC clean is a process of applying MRC constraints on the SRAFs to ensure that the characteristic pattern generated with these SRAF sets is compliant with manufacturing standards of a mask pattern.

The SRAF generator model 354 determines a reward value of the first SRAF set 605 using a scoring function. The scoring function uses image intensity and an intensity threshold that is used to extract the contour as parameters for determining the reward value. An example scoring function for determining the reward value, r, is as follows:

$$r = \sum_{(x,y) \text{ in srafset}} f(I(x, y) - threshold)$$

where threshold: threshold used to extract the contour (e.g., intensity threshold)

$$f(x):f(x) = \begin{cases} x & x \geq 0 \\ ax & x < 0 \end{cases} \text{ and } a = 0.1$$

I(x, y): Image Intensity of the reference image 305 at coordinates (x,y) in the SRAF set The SRAF generator model 354 updates the status value, S, of the skeleton points using the following algorithm:

```
for each skeleton points do {
  if skeleton point covered by (lies in or located within) an SRAF:
    N(i) = N(i) + 1
    R(i) = R(i) + r
    S(i) = R(i)/N(i)
} /* skeleton points loop */
``` where i is the index of skeleton point.

The above steps (e.g., beginning from selecting the cut-off points to updating the status value) may be considered as iteration "A" and the iteration "A" is repeated by selecting different cut-off points (e.g., random selection) to generate another SRAF set. For example, the SRAF generator model 354 repeats the iteration "A" by selecting a second cut-off point 611 to generate a second SRAF set 610. The reward value for the second SRAF set 610 is determined and the status values of the skeleton points are further updated. Note that the status value of the skeleton points is not reset to "0" after generating the first SRAF set 605. The SRAF generator model 354 repeats the iteration "A" a predefined number of times (e.g., one thousand or another number) by selecting different cut-off points every iteration and generating an SRAF set in each iteration "A" to generate "n" number of SRAF sets.

After generating "n" SRAF sets, the SRAF generator model 354 determines a threshold value for the status value (e.g., status threshold). The status threshold can be determined using any number of functions. For example, the status threshold can be determined as an average of the status values of the skeleton points. In another example, the status threshold can be determined as a function of a highest and lowest status values (e.g., lowest status value+specified percentage of the range, where range is difference between highest and lowest status value) of the skeleton points. After the status threshold is determined, the SRAF generator model 354 determines those of the skeleton points having status values below the status threshold as the cut-off points (e.g., skeleton points that are not to be covered by the SRAF set). After determining the cut-off points, the SRAF generator model 354 performs a random perturbation process and an MRC clean process on the "n" SRAF sets to make the "n" SRAF sets compliant with manufacturing standards of a mask pattern, calculate the reward of the SRAF sets and determine an SRAF set that has a reward satisfying a specified criterion (e.g., highest among the SRAF sets) as a preferred SRAF set 325 for the contour 310.

The SRAF generator model 354 may perform the above steps (e.g., beginning from processing a skeleton of the contour to determining the preferred SRAF set) for other contours (e.g., each of the contours) from the skeletonized representation 410 to generate preferred SRAF sets for the other contours.

After the preferred SRAF sets are determined, the SRAF generator model 354 can generate the characteristic pattern 320, which includes the contours extracted from the reference image 305 and their preferred SRAF sets.

One of the disadvantages with the above RL method is that the above method is model-free, which means that learning gained from determining the preferred SRAF set 325 and therefore, the above method may have to be performed each time a new contour is processed, which can become time consuming and compute intensive. In some embodiments, SRAF placement data can be generated from the preferred SRAF sets generated using the RL method, and can be used as training data to train an ML model, such as the SRAF placement model 353, to predict SRAF placement data that can be used in generating a preferred SRAF set for any contour. For example, based on the preferred SRAF set 325, SRAF placement data 620 can be generated. The SRAF placement data 620 indicates for each skeleton point on the skeleton 315, (a) location data 621 of the skeleton point, (b) skeleton distance information 622 of the skeleton point (e.g., a least distance from the skeleton point to the contour), and (c) a presence value 623 (e.g., a label) indicating whether the skeleton point is covered by (e.g., is present in, lies in or located within) the preferred SRAF set 325. The presence value 623 can be of any form, e.g., "0" or "1," where "0" may indicate that the skeleton point is not located, covered or present in the SRAFs of the preferred SRAF set 325 and "1" may indicate that the skeleton point is located, covered or present in the SRAFs of the preferred SRAF set 325. The SRAF placement data 620 generated from the preferred SRAF set 325 can be used as training data to train the SRAF placement model 353. Such SRAF placement data is created for a number of skeletons (e.g., of contours from one or more reference images) and are used to train the SRAF placement model 353 to predict which skeleton points are to be covered by an SRAF set. Additional details with respect to training the SRAF placement model 353 is discussed at least with reference to FIGS. 8 and 10 below.

Figure 7:
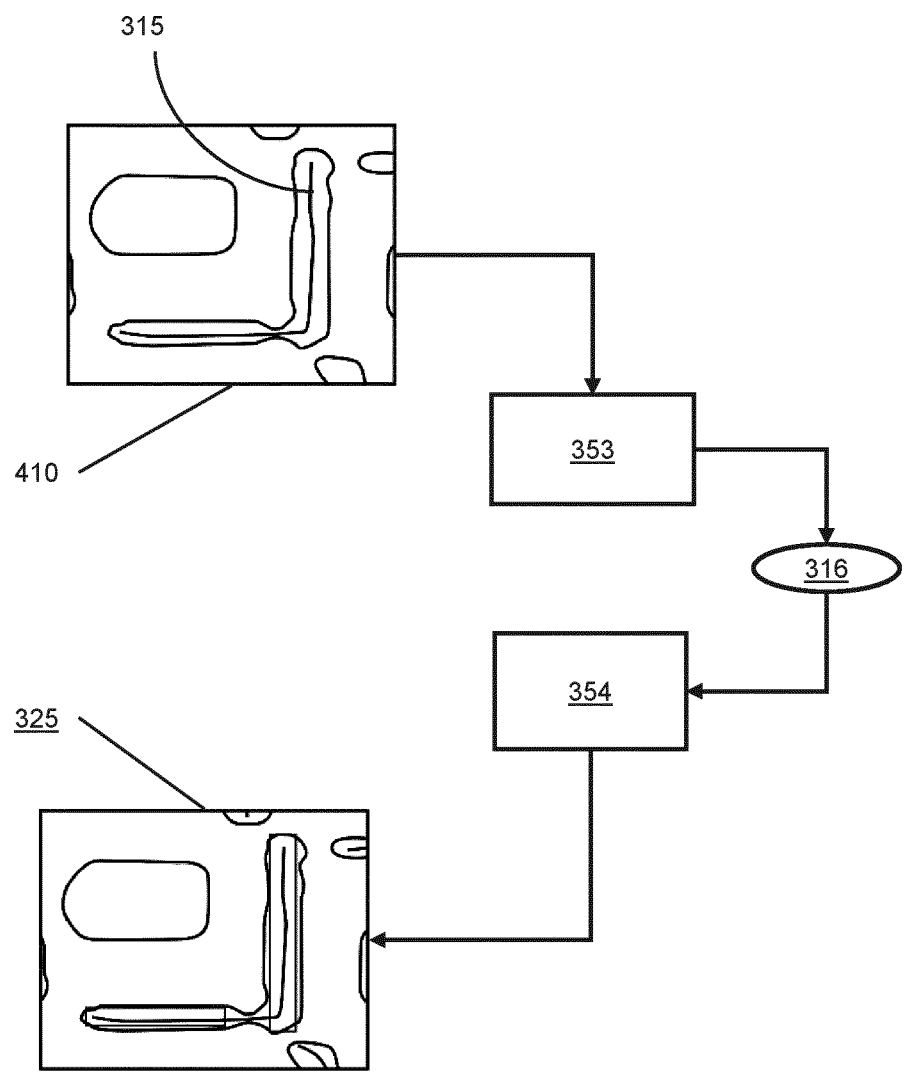
FIG. 7 is a block diagram for generation of a preferred SRAF set using a trained machine learning (ML) model, consistent with various embodiments.

FIG. 7 is a block diagram for generation of a preferred SRAF set using a trained ML model, consistent with various embodiments. The SRAF placement model 353 is trained to predict SRAF placement data, which indicates which skeleton points are to be covered by an SRAF set, for any given contour. In some embodiments, the SRAF placement model 353 is a sequence labeling model, such as BiLSTM network.

A skeletonized representation having a skeleton of a contour, such as the skeletonized representation 410 having the skeleton 315 of the contour 310, is input to the SRAF placement model 353. The skeletonized representation 410 is generated from the contour image 405, which is generated from the reference image 305, as described at least with reference to FIG. 4 above.

The SRAF placement model 353 processes the skeleton 315 to predict the SRAF placement data 316, which contains information about which skeleton points of the skeleton 315 are to be covered and which should not be covered by a preferred SRAF set. For example, the SRAF placement data 316 can include the location data (e.g., x,y) coordinates of a skeleton point, and a presence value (e.g., "0" or "1") indicating whether the skeleton point is to be covered (e.g., presence value "1") or not covered (e.g., presence value "0") for each skeleton point. That is, the SRAF placement data 316 includes a covered set of points, which are the skeleton points to be covered by the preferred SRAF set, and an uncovered set of points, which are the skeleton points not to be covered by the preferred SRAF set.

The predicted SRAF placement data 316 is then input to the SRAF generator model 354, which can determine the preferred SRAF set 325 for the contour 310 as described at least with reference to FIG. 6. For example, the SRAF generator model 354 selects one or more points from the uncovered set of points as cut-off points and then performs iteration "A" described at least with reference to FIG. 6 to generate an SRAF set and determine its reward. Then, the SRAF generator model 354 repeats the iteration "A" a predefined number of times by selecting a different cut-off point from the uncovered set of points and generate another SRAF set each time resulting in the generation of "n" number of SRAF sets, where "n" is the predefined number of times iteration A is performed. After generating "n" SRAF sets, the SRAF generator model 354 determines an SRAF set that has a reward satisfying a specified criterion (e.g., highest among the SRAF sets) as the preferred SRAF set 325 for the contour 310.

Similarly, a preferred SRAF set is determined for each of the contours from the reference image 305. The SRAF generator model 354 generates the characteristic pattern 320 based on the determined preferred SRAF sets.

Figure 8:
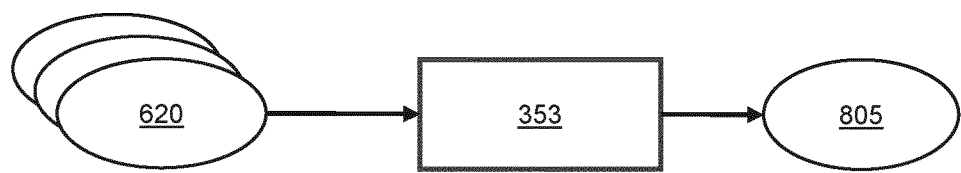
FIG. 8 is a block diagram for training a SRAF placement model to predict SRAF placement data, consistent with various embodiments.

FIG. 8 is a block diagram for training a SRAF placement model to predict SRAF placement data, consistent with various embodiments. As mentioned above, in some embodiments, the SRAF placement model 353 is implemented using a sequence labeling model, such as a BiLSTM neural network. A recurrent neural network (RNN) is a class of artificial neural networks where connections between nodes form a directed graph along a temporal sequence. The RNN is typically used for sequential input/output learning. Long short-term memory (LSTM) is a special RNN, capable of learning both short and long term dependencies, and it includes the following components: cell (memory)—is responsible for keeping track of the dependencies between the elements in the input sequence; input gate—controls the extent to which a new value flows into the cell; forget gate—controls the extent to which a value remains in the cell, and the output gate—controls the extent to which the value in the cell is used to compute the output activation of the LSTM unit. The activation function of the LSTM gates is often the logistic sigmoid function. In problems where all time steps of the input sequence are available, Bidirectional LSTMs train two instead of one recurrent network. The first is trained on the input sequence as-is, and the second on a time-reversed copy of the input sequence. This can provide additional context to the network and hopefully increase the accuracy of the network.

The SRAF placement model 353 is trained using training data, e.g., SRAF placement data 620 generated in the RL method as described at least with reference to FIG. 6. The training data includes SRAF placement data 620 for a skeleton, which indicates for each skeleton point on the skeleton, (a) location data 621 of the skeleton point (e.g., co-ordinates of the skeleton point in the skeletonized representation 410), (b) skeleton distance information 622 of the skeleton point (e.g., a least distance from the skeleton point to the contour), and (c) a presence value 623 indicating whether the skeleton point is covered by (e.g., is present in, lies in or located within) a preferred SRAF set. The presence value 623 can be of any form, e.g., "0" or "1," where "0" may indicate that the skeleton point is not located, covered or present in the SRAFs of the preferred SRAF set and "1" may indicate that the skeleton point is located, covered or present in the SRAFs of the preferred SRAF set.

The training is an iterative process and an iteration includes: inputting the SRAF placement data 620 to the SRAF placement model 353 to generate a predicted presence value 805 for each of the skeleton points (e.g., indicating whether a skeleton point is predicted to be covered by a preferred SRAF set or not), determining a metric or cost function associated with the predicted presence value 805 and the actual presence value (e.g., a difference between the predicted presence value 805 and the actual presence value from SRAF placement data 620), and adjusting the model parameters to minimize the metric. As an example, the model parameters are adjusted to reduce the difference. The training of the SRAF placement model 353 is continued by performing a number of iterations with additional SRAF placement data until a specified condition is satisfied (e.g., the metric is minimized or below a first threshold, and/or the rate at which the metric minimizes is less than a second threshold). Once the specified condition is satisfied, the SRAF placement model 353 is considered to be trained, and the trained SRAF placement model 353 can be used to predict the SRAF placement data for any contour (e.g., new or unseen contour, which is a contour not previously processed by the SRAF placement model 353). An example of predicting the SRAF placement data using the trained SRAF placement model 353 is described at least with reference to FIG. 7 above.

Figures 9A, 9B:
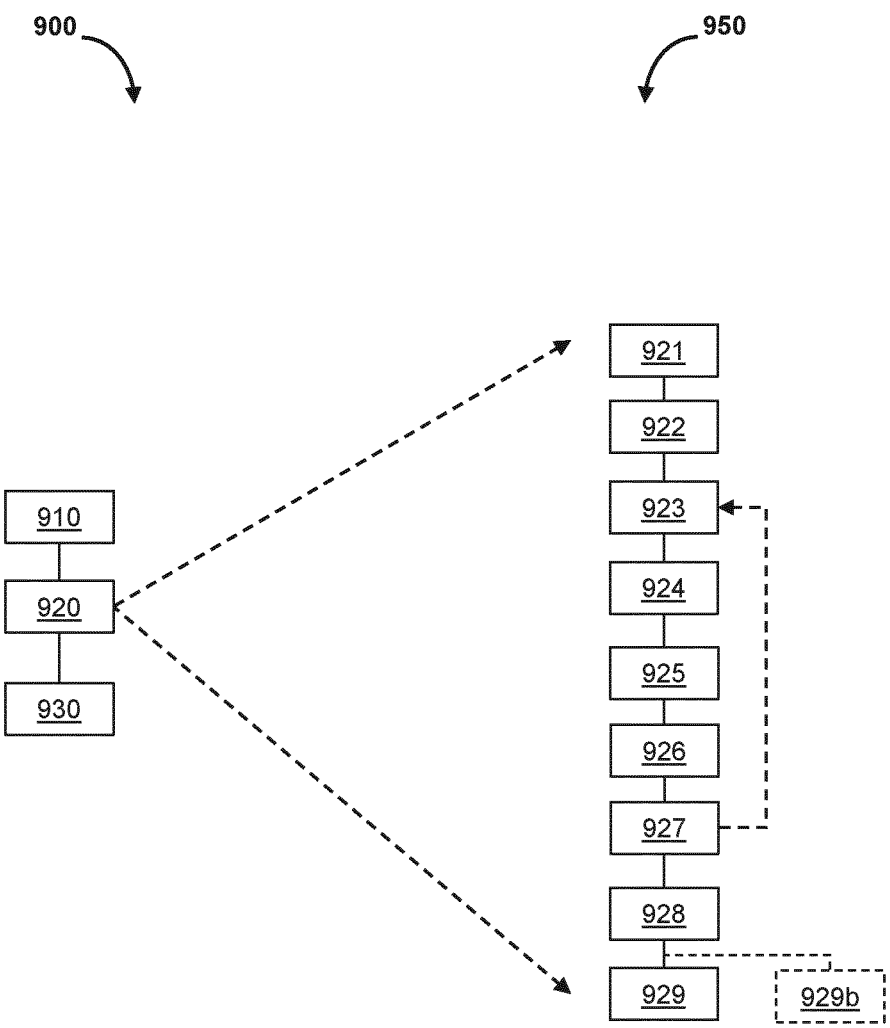
FIG. 9A is a flow diagram of a process for generating a characteristic pattern using reinforcement learning (RL) method, consistent with various embodiments.
FIG. 9B is a flow diagram of a process for determining a preferred SRAF set for a contour using the RL method, consistent with various embodiments.

FIG. 9A is a flow diagram of a process 900 for generating a characteristic pattern using RL method, consistent with various embodiments.

At operation 910, a contour 310 of a reference feature 307 (e.g., feature that corresponds to a target feature from a target pattern to be printed on the substrate) is obtained from a reference image 305. In some embodiments, the reference image 305 is a CTM and is obtained from the database 360.

A contour is extracted from the reference image 305 (e.g., using intensity threshold) as described at least with reference to FIG. 4.

At operation 920, the SRAF generator model 354 is executed to determine a preferred SRAF set 325 to be placed near the contour 310. In some embodiments, the preferred SRAF set 325 has a reward value that satisfies a specified condition (e.g., highest of all the SRAF sets generated for the contour 310). The reward value is determined as a function of intensity threshold value, e.g., as described at least with reference to FIG. 6. In some embodiments, the SRAF generator model 354 uses the RL method (e.g., Monte Carlo method) to determine the preferred SRAF set 325. In some embodiments, the SRAF generator model 354 invokes the operations described at least with reference to FIG. 9B to determine the preferred SRAF set for a contour. The SRAF generator model 354 provides a contour as input to the operations of FIG. 9B and receives the preferred SRAF set from those operations.

The operations 910 and 920 are repeated for other contours (e.g., each contour) in the reference image 305 to determine the preferred SRAF sets for the other contours.

At operation 930, the SRAF generator model 354 generates a characteristic pattern 320, which is an extraction friendly image that has the contours of the reference features from the reference image 305 and the preferred SRAF sets placed near the corresponding contours. For example, the SRAF generator model 354 generates the contour 310 with the preferred SRAF set 325 placed near the contour 310. In some embodiments, the characteristic pattern 320 is used to manufacture a mask pattern that is used in printing a target pattern on the substrate.

FIG. 9B is a flow diagram of a process 950 for determining a preferred SRAF set for a contour using the RL method, consistent with various embodiments. In some embodiments, the process 950 is performed as part of the operation 920 of process 900. At operation 921, a skeletonizer 352 receives as input a contour (e.g., contour 310) from operation 920 of process 900) and process the contour 310 to generate a skeleton 315 of the contour 310. The skeletonizer 352 generates the skeleton 315 using one of many image analysis techniques, e.g., as described at least with reference to FIG. 4.

At operation 922, the SRAF generator model 354 assigns the following parameters to each of the skeleton points on the skeleton 315 and initializes their values to "0."
R(i): Total Reward
N(i): Total Covered Times
S(i): Status Value At operation 923, the SRAF generator model 354 selects one or more cut-off points on the skeleton 315, which divides the skeleton 315 into two or more segments. For example, a first cut-off point 606 is selected, which divides the skeleton 315 into two segments.

At operation 924, the SRAF generator model 354 determines an SRAF for each segment, using the skeleton distance and MRC constraints. For example, for the two segments created by the first cut-off point 606, the SRAF generator model 354 generates a first SRAF 607 and a second SRAF 608, forming a first SRAF set 605.

At operation 925, the SRAF generator model 354 performs a random perturbation process and an MRC clean process on the first SRAF set 605 to make the first SRAF set 605 compliant with manufacturing standards of a mask pattern. In some embodiments, random perturbation is a process that slightly offsets the image, or mirrors the image horizontally or vertically. One of the reasons random perturbation is performed is to reduce overfitting the ML model. As described above, the MRC clean is a process of applying MRC constraints on the SRAFs to ensure that the characteristic pattern generated with these SRAF sets is compliant with manufacturing standards of a mask pattern.

At operation 926, the SRAF generator model 354 determines a reward value of the first SRAF set 605 using a scoring function. The scoring function uses image intensity and an intensity threshold that is used to extract the contour as parameters for determining the reward value. An example scoring function for determining the reward value, r, is as follows:

$$r = \sum_{(x,y) \in srafset} f(I(x, y) - threshold)$$

where threshold: threshold used to extract the contour (e.g., intensity threshold)

$$f(x): f(x) = \begin{cases} x & x \geq 0 \\ ax & x < 0 \end{cases} \text{ and } a = 0.1$$

I(x, y): Image Intensity of the reference image 305 at coordinates (x, y) in the SRAF set At operation 927, the SRAF generator model 354 updates the status value, S, of the skeleton points using the following algorithm:

```
for each skeleton points do {
  if skeleton point covered by (lies in or located within) an SRAF:
    N(i) = N(i) + 1
    R(i) = R(i) + r
    S(i) = R(i)/N(i)
} /* skeleton points loop */
``` where i is the index of skeleton point.

The SRAF generator model 354 repeats the operations 923-927 a predefined number of times (e.g., one thousand times or another number) by selecting different cut-off points each time and generating an SRAF set each time resulting in generation of "n" number of SRAF sets, wherein "n" is the predefined number of times. The reward value for each of the SRAF sets is determined and the status values of the skeleton points are further updated. Note that the status value of the skeleton points is not reset to "0" each time the operations 923-927 are repeated.

At operation 928, the SRAF generator model 354 determines a threshold value for the status value (e.g., status threshold). The status threshold can be determined using any number of functions (e.g., as an average of the status values of the skeleton points, and as a function of a highest and lowest status values (e.g., lowest status value+specified percentage of the range, where range is difference between highest and lowest status value)). After the status threshold is determined, the SRAF generator model 354 determines those of the skeleton points having a status value below the status threshold as the cut-off points (e.g., skeleton points that are not to be covered by the SRAF set). After determining the cut-off points, the SRAF generator model 354 performs the operations 925-927 to make the "n" SRAF sets compliant with manufacturing standards of a mask pattern and calculate the updated reward value of the SRAF sets.

At operation 929, the SRAF generator model 354 determines an SRAF set that has a reward satisfying a specified criterion (e.g., highest among the SRAF sets) as a preferred SRAF set 325 for the contour 310. The preferred SRAF set 325 is now returned to the operation 920 of FIG. 9A.

In some embodiments, at operation 929b, the SRAF generator model 354 generates SRAF placement data from the preferred SRAF sets, which can be used as training data to train an ML model, such as the SRAF placement model 353, to predict SRAF placement data that can be used in generating a preferred SRAF set for any contour. For example, the SRAF generator model 354 generates SRAF placement data 620 based on the preferred SRAF set 325. The SRAF placement data 620 indicates for each skeleton point on the skeleton 315, (a) location data of the skeleton point, (b) skeleton distance information of the skeleton point (e.g., a least distance from the skeleton point to the contour), and (c) a presence value (e.g., label) indicating whether the skeleton point is covered by (e.g., is present in, lies in or located within) the preferred SRAF set 325. The presence value can be of any form, e.g., "0" or "1," where "0" may indicate that the skeleton point is not located, covered or present in the SRAFs of the preferred SRAF set 325 and "1" may indicate that the skeleton point is located, covered or present in the SRAFs of the preferred SRAF set 325. Such SRAF placement data is created for a number of skeletons (e.g., of contours from one or more reference images) and are used to train the SRAF placement model 353 to predict which skeleton points are to be covered by an SRAF set.

Note that the operation 929b, which is used to generate training data, is optional and not required to determine the preferred SRAF set using the RL method.

Figure 10:
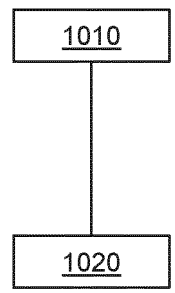
FIG. 10 is a flow diagram of a process for training a machine learning model to predict SRAF placement data, consistent with various embodiments.

FIG. 10 is a flow diagram of a process 1000 for training a machine learning model to predict SRAF placement data, consistent with various embodiments. As mentioned above, in some embodiments, the SRAF placement model 353 is implemented using BiLSTM neural network.

At operation 1010, training data associated with a reference feature 307 in a reference image 305 is obtained, e.g., from database 360. The training data is used to train the SRAF placement model 353 to predict SRAF placement data that can be used in determining a preferred SRAF set for a contour is obtained. The training data includes (i) location data of each portion of a plurality of portions of the reference feature 307, and (iii) a presence value 623 indicating whether the portion of the reference feature 307 is located within a reference assist feature generated for the reference feature 307. For example, the training data includes SRAF placement data 620 for a skeleton 315 generated from the contour 310 of the reference feature 307. The SRAF placement data 620 for the skeleton 315 indicates for each skeleton point on the skeleton: (a) location data 621 of the skeleton point on the skeleton 315, (b) skeleton distance information 622 of the skeleton point (e.g., least distance from the skeleton point to the contour), and (c) a presence value 623 indicating whether the skeleton point is covered by (e.g., is present in, lies in or located within) a preferred SRAF set 325. The presence value 623 can be of any form, e.g., "0" or "1," where "0" may indicate that the skeleton point is not located, covered or present in the SRAFs of the preferred SRAF set and "1" may indicate that the skeleton point is located, covered or present in the SRAFs of the preferred SRAF set 325. In some embodiments, the training data is generated by the SRAF generator model 354 using the RL method as described at least with reference to FIG. 6 and operation 929b of FIG. 9. In some embodiments, the training data includes SRAF placement data for a number of skeletons.

At operation 1020, the SRAF placement model 353 is trained using the training data associated with the reference feature 307 such that a metric between a predicted presence value 805 and the presence value 623 is minimized The training is an iterative process and an iteration includes: inputting the training data (e.g., SRAF placement data 620) to the SRAF placement model 353 to generate a predicted presence value 805 for each of the skeleton points (e.g., skeleton points of the skeleton 315), which indicates whether a skeleton point is predicted to be covered by a preferred SRAF set or not, determining a metric associated with the predicted presence value 805 and the actual presence value (e.g., a difference between the predicted presence value 805 and the actual presence value from SRAF placement data 620), and adjusting the model parameters to minimize the metric. As an example, the model parameters are adjusted to reduce the difference. The training of the SRAF placement model 353 is continued by performing a number of iterations with additional SRAF placement data until a specified condition is satisfied (e.g., the metric is minimized or below a first threshold, and/or the rate at which the metric minimizes is less than a second threshold).

Once the specified condition is satisfied, the SRAF placement model 353 is considered to be trained, and the trained SRAF placement model 353 can be used to predict the SRAF placement data for any contour (e.g., new or unseen contour, which is a contour not previously processed by the SRAF placement model 353). An example of predicting the SRAF placement data using the trained SRAF placement model 353 is described at least with reference to FIG. 7 above and FIG. 11 below.

Figures 11A, 11B:
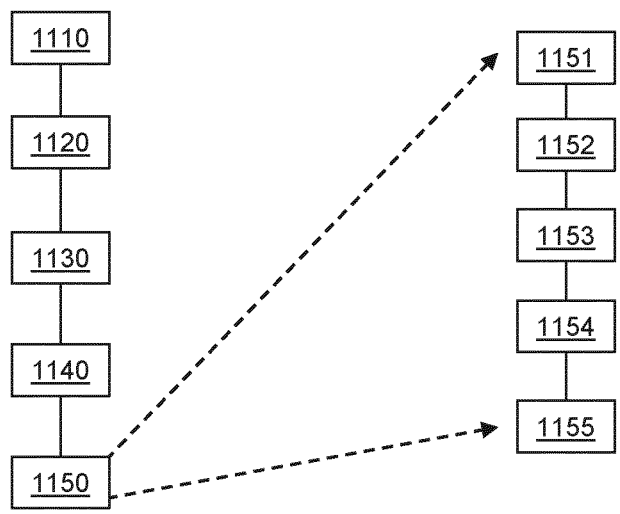
FIG. 11A is a flow diagram of a process for generating a characteristic pattern using a presence value predicted by a ML model, consistent with various embodiments.
FIG. 11B is a flow diagram of a process 1175 for determining a preferred SRAF set based on a presence value predicted by an ML model, consistent with various embodiments.

FIG. 11A is a flow diagram of a process 1100 for generating a characteristic pattern using a presence value predicted by a ML model, consistent with various embodiments. In some embodiments, the ML model, such as the SRAF placement model 353, is trained to predict a presence value that indicates which skeleton points of a skeleton are to be covered and which skeleton points are not be covered by a preferred SRAF set for a contour. The training is performed as described at least with reference to FIGS. 8 and 10 above. The following operations are performed using the trained SRAF placement model 353.

At operation 1110, a reference image 305 is obtained, e.g., from database 360. In some embodiments, the reference image 305 is a CTM.

At operation 1120, a contour 310 of a reference feature 307 (e.g., feature that corresponds to a target feature from a target pattern to be printed on the substrate) is obtained from the reference image 305. A contour is extracted from the reference image 305 (e.g., using intensity threshold) as described at least with reference to FIG. 4.

At operation 1130, a skeletonizer 352 processes the contour 310 to generate a skeleton 315 of the contour 310. The skeletonizer 352 generates the skeleton 315 using one of many image analysis techniques, e.g., as described at least with reference to FIG. 4.

At operation 1140, the SRAF placement model 353 processes the skeleton 315 to determine or generate the SRAF placement data 316, which contains a predicted presence value 805. For example, the SRAF placement data 316 can include, for each skeleton point, the location data (e.g., x,y) coordinates of a skeleton point, and a predicted presence value 805 (e.g., "0" or "1") indicating whether the skeleton point is to be covered (e.g., presence value "1") or not covered (e.g., presence value "0"). That is, the SRAF placement data 316 includes a covered set of points, which are skeleton points that are to be covered by the preferred SRAF set, and an uncovered set of points, which are skeleton points that are not to be covered by the preferred SRAF set.

At operation 1150, the SRAF generator model 354 generates a characteristic pattern 320 based on the predicted presence value 805. In some embodiments, the SRAF generator model 354 determines a preferred SRAF set for the contour 310 using the presence value 805 in the operations described in FIG. 11B below. Similarly, preferred SRAF sets are determined for other contours in the reference image 305. After the preferred SRAF sets are determined for the contours in the reference image 305, the SRAF generator model 354 generates the characteristic pattern 320 based on the preferred SRAF sets. In some embodiments, the characteristic pattern 320 is an extraction friendly image that has the contours of the reference features from the reference image 305 and preferred SRAF sets placed near the corresponding contours. In some embodiments, the characteristic pattern 320 is used to manufacture a mask pattern that is used in printing a target pattern on the substrate.

FIG. 11B is a flow diagram of a process 1175 for determining a preferred SRAF set based on a presence value predicted by a ML model, consistent with various embodiments. In some embodiments, the operations of process 1175 are performed as part of operation 1150 of process 1100 of FIG. 11A and are similar to some of the operations of the RL method discussed at least with reference to process 950 of FIG. 9B. The process 1175 receives as input SRAF placement data having a predicted presence value for a skeleton (e.g., SRAF placement data 316 having the predicted presence value 805 for skeleton 315) and outputs a predicted SRAF for the skeleton.

At operation 1151, the SRAF generator model 354 selects one or more points from the uncovered set of points in the SRAF placement data 316 as cut-off points, which divides the skeleton 315 into multiple segments.

At operation 1152, the SRAF generator model 354 performs an operation similar to the operation 924 of process 950 to determine an SRAF for each segment, using the skeleton distance and MRC constraints. For example, for the two segments created by the first cut-off point 606, the SRAF generator model 354 generates a first SRAF 607 and a second SRAF 608, forming a first SRAF set 605.

At operation 1153, the SRAF generator model 354 performs an operation similar to the operation 925 of process 950, which incldues performing a random perturbation process and an MRC clean process on the first SRAF set 605 to make the first SRAF set 605 compliant with manufacturing standards of a mask pattern.

At operation 1154, the SRAF generator model 354 performs an operation similar to the operation 926 of process 950 to determine a reward value of the first SRAF set 605 using a scoring function.

At operation 1155, the SRAF generator model 354 performs an operation similar to the operation 927 to updates the status value, S, of the skeleton points.

At operation 1156, the SRAF generator model 354 performs an operation similar to the operation 929 to determine an SRAF set that has a reward satisfying a specified criterion (e.g., highest among the SRAF sets) as a preferred SRAF set 325 for the contour 310. The preferred SRAF set 325 is now returned to the operation 1150 of process 1100.

Figure 12:
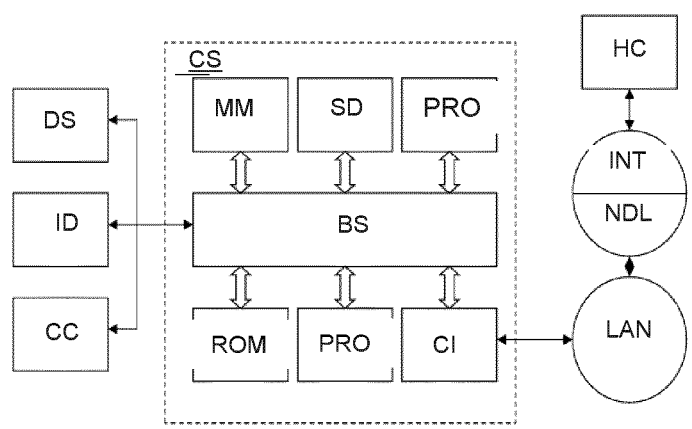
FIG. 12 is a block diagram of an example computer system, according to an embodiment.

FIG. 12 is a block diagram of an example computer system CS, according to an embodiment.

Computer system CS includes a bus BS or other communication mechanism for communicating information, and a processor PRO (or multiple processor) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

According to the present disclosure, the combination and sub-combinations of disclosed elements constitute separate embodiments. For example, the method for generating a predicted measured image and the method for aligning a measured image with the predicted measured image may comprise separate embodiments, and/or these methods may be used together in the same embodiment.

Figure 13:
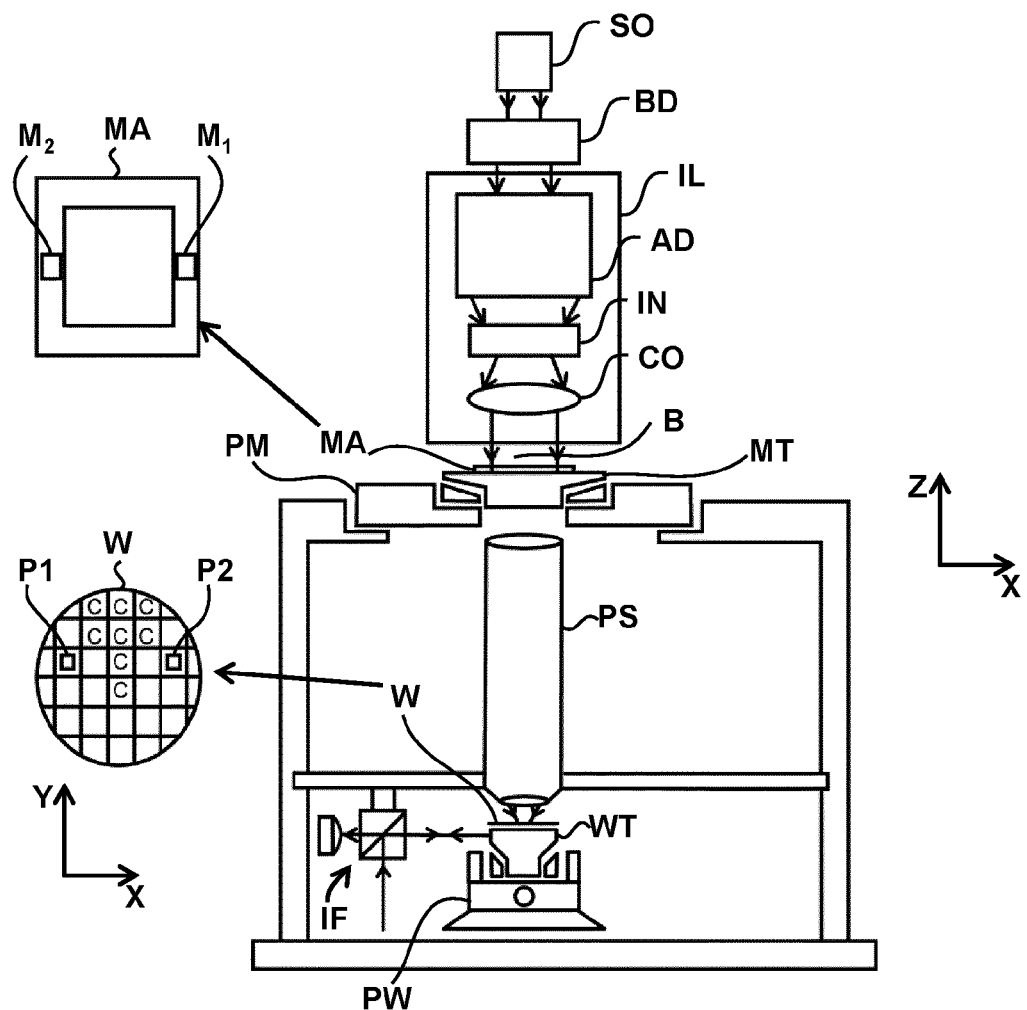
FIG. 13 is a schematic diagram of a lithographic projection apparatus, according to an embodiment.

FIG. 13 is a schematic diagram of a lithographic projection apparatus, according to an embodiment.

The lithographic projection apparatus can include an illumination system IL, a first object table MT, a second object table WT, and a projection system PS.

Illumination system IL, can condition a beam B of radiation. In this particular case, the illumination system also comprises a radiation source SO.

First object table (e.g., patterning device table) MT can be provided with a patterning device holder to hold a patterning device MA (e.g., a reticle), and connected to a first positioner to accurately position the patterning device with respect to item PS.

Second object table (substrate table) WT can be provided with a substrate holder to hold a substrate W (e.g., a resist-coated silicon wafer), and connected to a second positioner to accurately position the substrate with respect to item PS.

Projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or F2 lasing).

The beam PB can subsequently intercept patterning device MA, which is held on a patterning device table MT. Having traversed patterning device MA, the beam B can pass through the lens PL, which focuses beam B onto target portion C of substrate W. With the aid of the second positioning means (and interferometric measuring means IF), the substrate table WT can be moved accurately, e.g. so as to position different target portions C in the path of beam PB. Similarly, the first positioning means can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool) patterning device table MT may just be connected to a short stroke actuator, or may be fixed.

The depicted tool can be used in two different modes, step mode and scan mode. In step mode, patterning device table MT is kept essentially stationary, and an entire patterning device image is projected in one go (i.e., a single "flash") onto a target portion C. Substrate table WT can be shifted in the x and/or y directions so that a different target portion C can be irradiated by beam PB.

In scan mode, essentially the same scenario applies, except that a given target portion C is not exposed in a single "flash." Instead, patterning device table MT is movable in a given direction (the so-called "scan direction", e.g., the y direction) with a speed v, so that projection beam B is caused to scan over a patterning device image; concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 14:
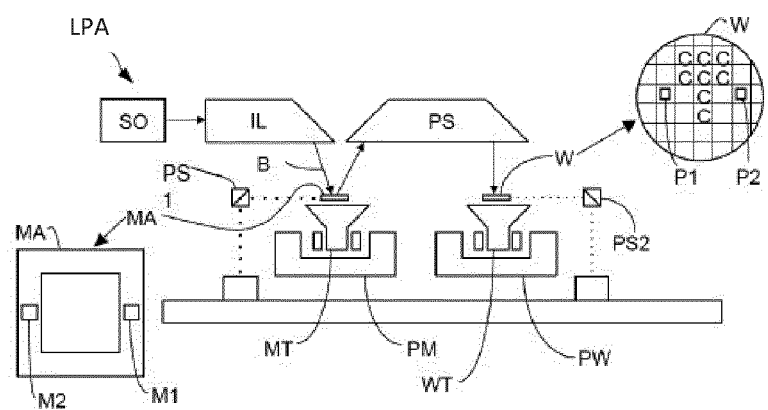
FIG. 14 is a schematic diagram of another lithographic projection apparatus, according to an embodiment.

FIG. 14 is a schematic diagram of another lithographic projection apparatus (LPA), according to an embodiment.

LPA can include source collector module SO, illumination system (illuminator) IL configured to condition a radiation beam B (e.g. EUV radiation), support structure MT, substrate table WT, and projection system PS.

Support structure (e.g. a patterning device table) MT can be constructed to support a patterning device (e.g. a mask or a reticle) MA and connected to a first positioner PM configured to accurately position the patterning device;

Substrate table (e.g. a wafer table) WT can be constructed to hold a substrate (e.g. a resist coated wafer) W and connected to a second positioner PW configured to accurately position the substrate.

Projection system (e.g. a reflective projection system) PS can be configured to project a pattern imparted to the radiation beam B by patterning device MA onto a target portion C (e.g. comprising one or more dies) of the substrate W.

As here depicted, LPA can be of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

Illuminator IL may comprise an adjuster for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode.

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de-) magnification and image reversal characteristics of the projection system PS.

In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 15:
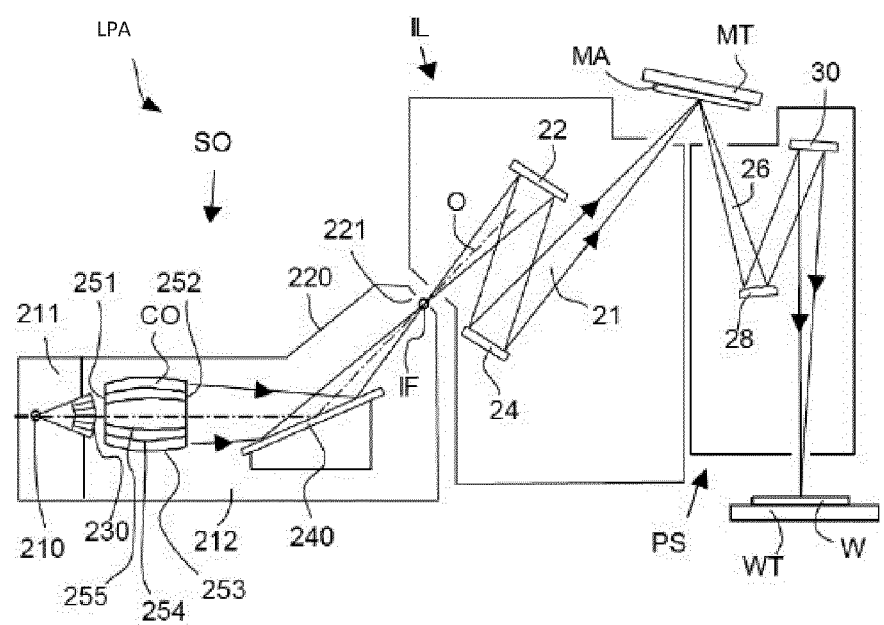
FIG. 15 is a detailed view of the lithographic projection apparatus, according to an embodiment.

FIG. 15 is a detailed view of the lithographic projection apparatus, according to an embodiment.

As shown, LPA can include the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line '0'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 13.

Collector optic CO, as illustrated in FIG. 13, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 16:
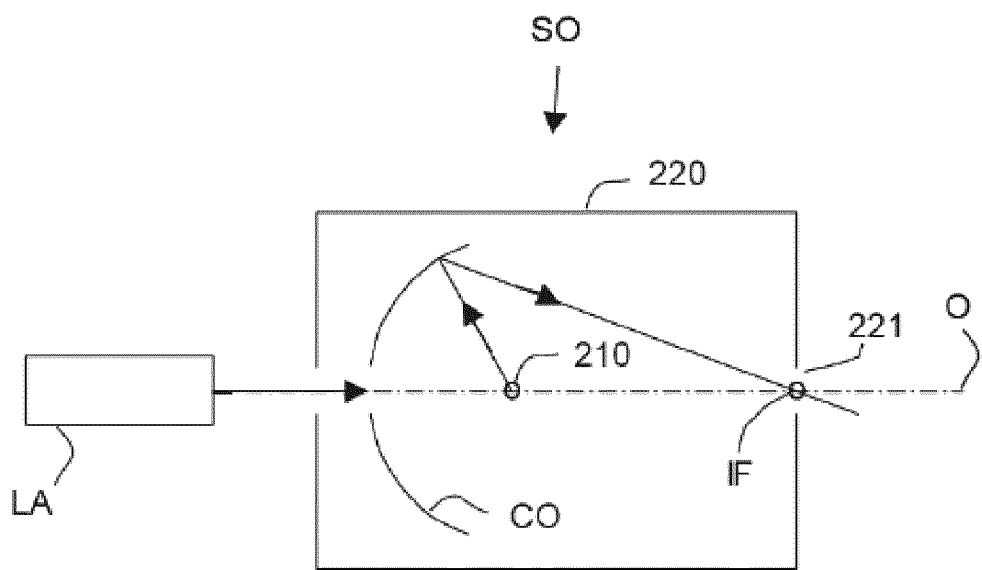
FIG. 16 is a detailed view of the source collector module of the lithographic projection apparatus, according to an embodiment.

FIG. 16 is a detailed view of source collector module SO of lithographic projection apparatus LPA, according to an embodiment.

Source collector module SO may be part of an LPA radiation system. A laser LA can be arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

Figure 17:
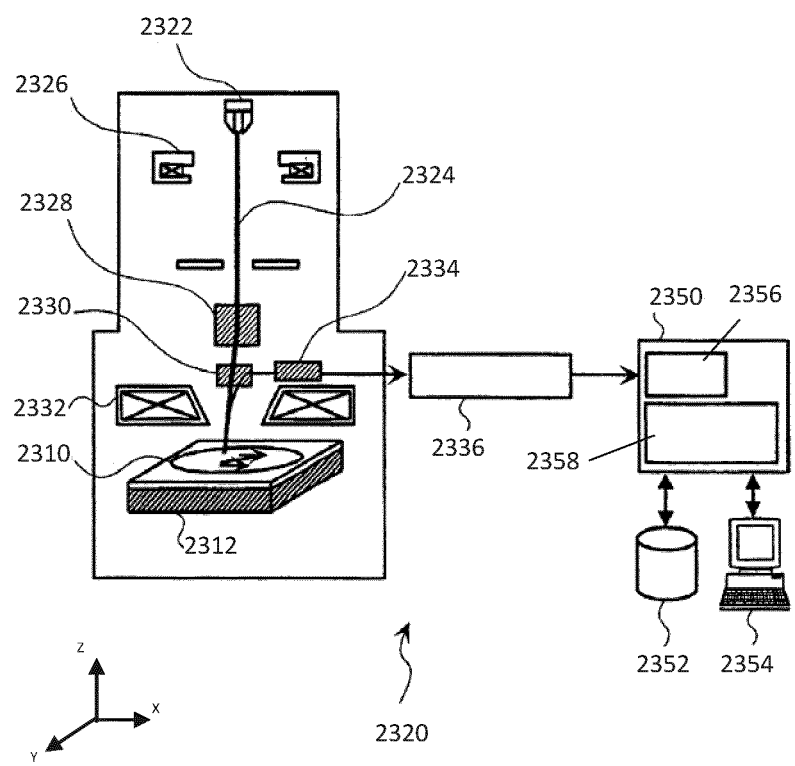
FIG. 17 schematically depicts an embodiment of an electron beam inspection apparatus, according to an embodiment.

FIG. 17 schematically depicts an embodiment of an electron beam inspection apparatus 2320, according to an embodiment. In an embodiment, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate. A primary electron beam 2324 emitted from an electron source 2322 is converged by condenser lens 2326 and then passes through a beam deflector 2328, an E×B deflector 2330, and an objective lens 2332 to irradiate a substrate 2310 on a substrate table 2312 at a focus.

When the substrate 2310 is irradiated with electron beam 2324, secondary electrons are generated from the substrate 2310. The secondary electrons are deflected by the E×B deflector 2330 and detected by a secondary electron detector 2334. A two-dimensional electron beam image can be obtained by detecting the electrons generated from the sample in synchronization with, e.g., two dimensional scanning of the electron beam by beam deflector 2328 or with repetitive scanning of electron beam 2324 by beam deflector 2328 in an X or Y direction, together with continuous movement of the substrate 2310 by the substrate table 2312 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 2328 can provide the electron beam 2324). Thus, the spatial extent of the field of the view is the spatial extent to which the angular range of the electron beam can impinge on a surface (wherein the surface can be stationary or can move with respect to the field).

A signal detected by secondary electron detector 2334 is converted to a digital signal by an analog/digital (A/D)

converter 2336, and the digital signal is sent to an image processing system 2350. In an embodiment, the image processing system 2350 may have memory 2356 to store all or part of digital images for processing by a processing unit 2358. The processing unit 2358 (e.g., specially designed hardware or a combination of hardware and software or a computer readable medium comprising software) is configured to convert or process the digital images into datasets representative of the digital images. In an embodiment, the processing unit 2358 is configured or programmed to cause execution of a method described herein. Further, image processing system 2350 may have a storage medium 2356 configured to store the digital images and corresponding datasets in a reference database. A display device 2354 may be connected with the image processing system 2350, so that an operator can conduct necessary operation of the equipment with the help of a graphical user interface.

Figure 18:
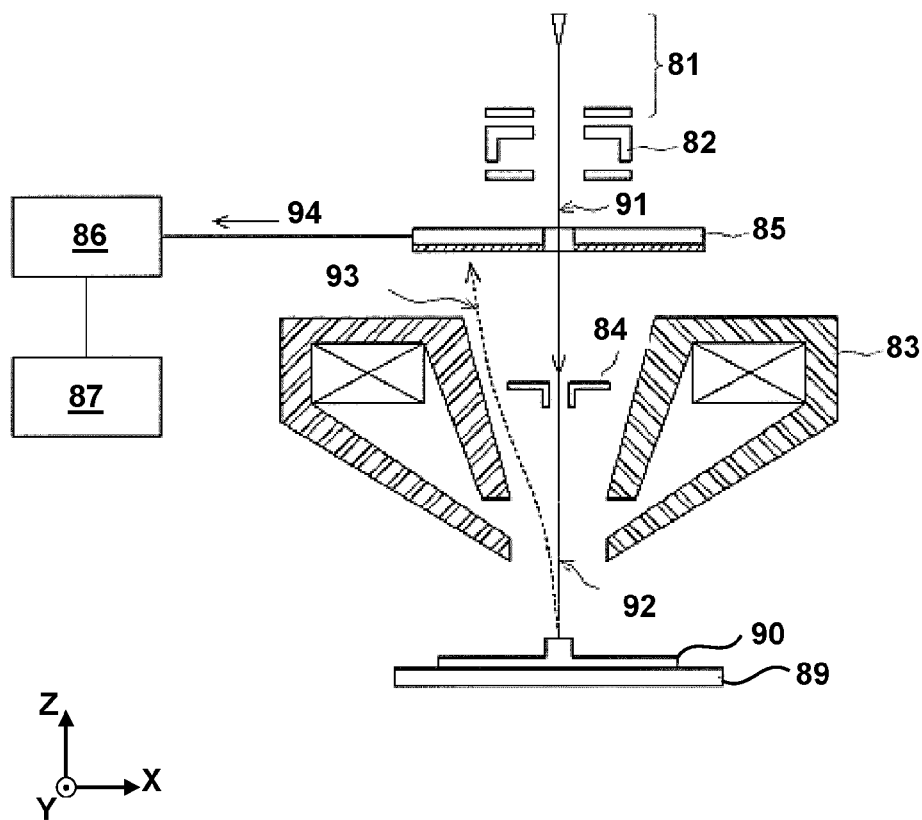
FIG. 18 schematically illustrates a further embodiment of an inspection apparatus, according to an embodiment.

FIG. 18 schematically illustrates a further embodiment of an inspection apparatus, according to an embodiment. The system is used to inspect a sample 90 (such as a substrate) on a sample stage 88 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 88. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

Figure 19:
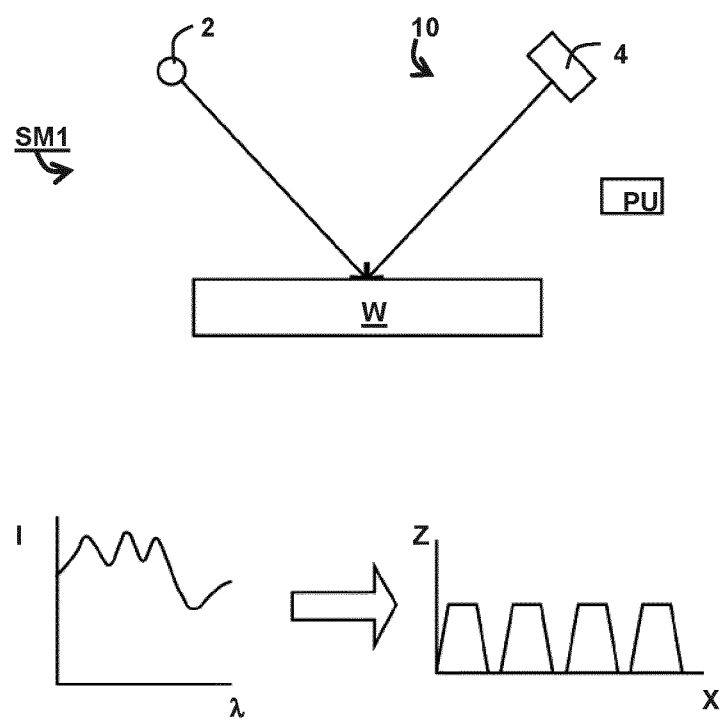
FIG. 19 schematically depicts an example inspection apparatus and metrology technique.
Figure 20:
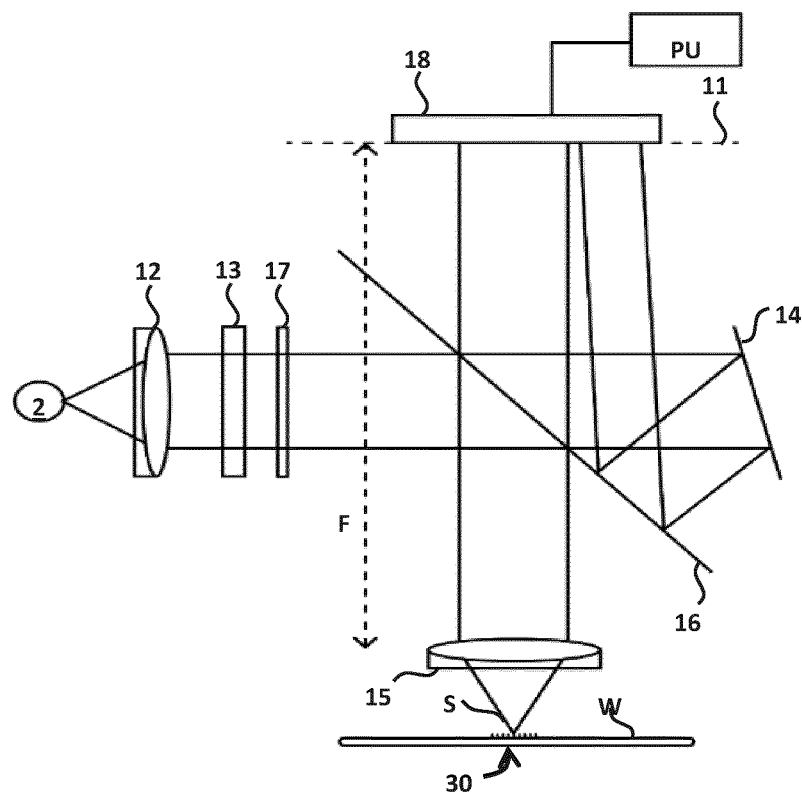
FIG. 20 schematically depicts an example inspection apparatus.

In an embodiment, like the electron beam inspection tool of FIG. 19 that uses a probe to inspect a substrate, the electron current in the system of FIG. 20 is significantly larger compared to, e.g., a CD SEM such as depicted in FIG. 19, such that the probe spot is large enough so that the inspection speed can be fast. However, the resolution may not be as high as compared to a CD SEM because of the large probe spot.

The SEM images, from, e.g., the system of FIG. 19 and/or FIG. 20, may be processed to extract contours that describe the edges of objects, representing device structures, in the image These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images. Alternatively, metrics can include EP gauges as described herein.

Now, besides measuring substrates in a patterning process, it is often desirable to use one or more tools to produce results that, for example, can be used to design, control, monitor, etc. the patterning process. To do this, there may be provided one or more tools used in computationally controlling, designing, etc. one or more aspects of the patterning process, such as the pattern design for a patterning device (including, for example, adding sub-resolution assist features or optical proximity corrections), the illumination for the patterning device, etc. Accordingly, in a system for computationally controlling, designing, etc. a manufacturing process involving patterning, the major manufacturing system components and/or processes can be described by various functional modules. In particular, in an embodiment, one or more mathematical models can be provided that describe one or more steps and/or apparatuses of the patterning process, including typically the pattern transfer step. In an embodiment, a simulation of the patterning process can be performed using one or more mathematical models to simulate how the patterning process forms a patterned substrate using a measured or design pattern provided by a patterning device.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

FIG. 19 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Another inspection apparatus that may be used is shown in FIG. 20. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 25 or FIG. 26 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 20, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 21:
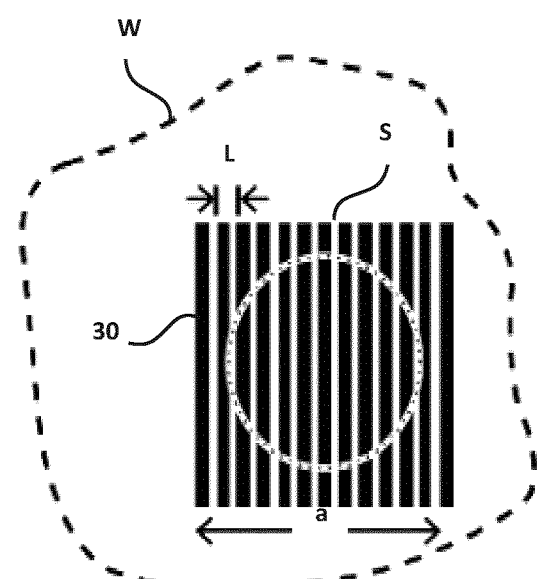
FIG. 21 illustrates the relationship between an illumination spot of an inspection apparatus and a metrology target.

FIG. 21 illustrates a plan view of a typical target 30, and the extent of illumination spot S in the apparatus of FIG. 20. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

The embodiments may further be described using the following clauses:

1. A non-transitory computer-readable medium having instructions that, when executed by a computer, cause the computer to execute a method for training a machine learning model to generate a characteristic pattern, the method comprising:
   obtaining training data associated with a reference feature in a reference image, wherein the training data includes (i) location data of a portion of the reference feature, and (ii) a presence value indicating whether the portion of the reference feature is located within a reference assist feature generated for the reference feature; and
   training, based on the training data, the machine learning model such that a metric between a predicted presence value and the presence value is minimized 2. The computer-readable medium of any of clause 1, wherein the characteristic pattern is used for manufacturing a mask pattern, which is further used for printing a target pattern on a substrate.

3. The computer-readable medium of any of clause 2, wherein the reference image is a continuous transmission mask (CTM) image generated by simulating an optical proximity correction process using the target pattern, and wherein the reference feature corresponds to a target feature from the target pattern.

4. The computer-readable medium of clause 2, wherein the reference assist feature includes sub-resolution assist features placed around the reference feature, the sub-resolution assist features being rectilinear in shape.

5. The computer-readable medium of clause 4, wherein the sub-resolution assist features are rectilinear in shape.

6. The computer-readable medium of any of clauses 1-5, wherein the training data includes training data for a plurality of reference features in one or more reference images.

7. The computer-readable medium of any of clause 1, wherein the location data includes location data of each portion of a plurality of portions of the reference feature.

8. The computer-readable medium of any of clauses 1-7, wherein training the machine learning model includes:
   a. executing, the machine learning model using the training data, to output the predicted presence value associated with the corresponding portion of the reference feature;
   b. determining the metric between the predicted presence value and the presence value;
   c. adjusting the machine learning model such that the metric is reduced;
   d. determining whether the metric is minimized; and
   e. responsive to not minimized, performing steps (a), (b), (c), and (d).

9. The computer-readable medium of any of clauses 1-8, the method further comprising:
   obtaining a specified reference image; and
      determining, via executing the machine learning model using the specified reference image, a preferred assist feature for placement in relation to a specified feature of the specified reference image, wherein the specified feature corresponds to a target feature of a target pattern to be printed on the substrate.

10. The computer-readable medium of clause 9, wherein determining the preferred assist feature includes:
   obtaining, from the specified reference image and using an intensity threshold, a specified contour of the specified feature,
   generating a skeleton of the specified contour,
   inputting location data and distance data to the machine learning model, wherein the location data includes coordinates of a set of points on the skeleton, wherein the distance data indicates a closest distance from a point of the set of points to the specified contour, and
   obtaining, from the machine learning model, a predicted presence value for each point of the set of points, wherein the predicted presence value indicates whether the corresponding point is predicted to be located within the preferred assist feature, wherein the set of points includes
   (a) a covered set of points that is predicted to located within the preferred assist feature, and
   (b) an uncovered set of points that is predicted not to be located within the preferred assist feature.

11. The computer-readable medium of clause 10, the method further comprising:
   generating a plurality of assist feature sets to cover points from the covered set of points,
   determining a reward value for each assist feature set using a scoring function, and
   determining a first assist feature set of the assist feature sets having a highest reward value as the preferred assist feature for placement in relation to the specified contour.

12. The computer-readable medium of clause 11, wherein determining the reward value for each assist feature set includes:
   (i) selecting a point from the uncovered set of points as a cut-off point, wherein the cut-off point divides the skeleton into a plurality of segments,
   (ii) generating an assist feature set of the plurality of assist feature sets having a candidate assist feature for each segment of the plurality of segments, wherein the candidate assist feature is generated based on (a) the distance data associated with each point of the set of points, and (b) a set of constraints the candidate assist feature has to satisfy for manufacturing of the mask pattern,
   (iii) determining a reward value associated with the assist feature set as a function of (a) image intensity value within the assist feature set, and (b) the intensity threshold, and
   iterating through steps (i), (ii) and (iii) by selecting a different cut-off point from the uncovered set of points, generating another assist feature set, and determining their corresponding reward value.

13. The computer-readable medium of clause 12, wherein the distance value indicates a closest distance from a point to the specified contour.

14. The computer-readable medium of clause 9, the method further comprising:
   generating a characteristic pattern with the preferred assist feature, wherein the characteristic pattern is a pixelated image that includes the preferred assist feature placed in relation to the specified feature.

15. The computer-readable medium of clause 14, wherein generating the characteristic pattern includes:
   generating the characteristic pattern with a plurality of preferred assist features, wherein the preferred assist features are placed in relation to a plurality of reference features of the specified reference image, wherein the preferred assist features are determined by executing the machine learning model for the reference features.

16. The computer-readable medium of clause 15, wherein generating the characteristic pattern includes:

adjusting the placement of the preferred assist features further based on a set of constraints related to manufacturing of the mask pattern.

17. The computer-readable medium of clause 1, wherein the machine learning model is a sequence labeling model.

18. The computer-readable medium of clause 17, wherein the sequence labeling model includes a Bidirectional Long Short-term Memory (BiLSTM) network.

19. The computer-readable medium of clause 1, wherein obtaining the training data includes:
  generating a plurality of assist feature sets for the reference feature based on a set of constraints for manufacturing of a mask pattern, wherein each assist feature set is associated with a reward value that is determined based on a specified scoring function,
  determining a specified assist feature set of the plurality of assist feature sets associated with a highest reward value as the reference assist feature,
  determining a status value for each portion of the reference feature as a function of the reward value of the plurality of assist feature sets and a number of assist feature sets in which the corresponding portion is determined to be located within, and
  generating the location data and the presence value of the training data for each portion of the reference feature, wherein the presence value is set to a first value if the status value of the corresponding portion satisfies a status threshold, the first value indicating that the corresponding portion is located within the reference assist feature.

20. The computer-readable medium of clause 19, wherein generating the presence value includes:
  a. setting the presence value to a second value if the status value of the corresponding portion does not satisfy the status threshold, the second value indicating that the corresponding portion is not located within the reference assist feature.

21. The computer-readable medium of clause 19, wherein generating the plurality of assist feature sets includes:
  generating a skeleton of the reference feature,
  selecting a plurality of cut-off points on the skeleton, wherein each cut-off point segments the skeleton into a plurality of segments, and
  for each cut-off point, generating an assist feature set having a reference assist feature for each segment of the plurality of segments, wherein the assist feature set is generated based on the set of constraints and a distance value associated with each point of a set of points on the skeleton.

22. The computer-readable medium of clause 21, wherein determining the specified assist feature set having the highest reward value includes:
  determining, using the specified scoring function, the reward value of an assist feature set of the plurality of assist feature sets as a function of (a) image intensity value within the assist feature set, and (b) an intensity threshold.

23. The computer-readable medium of clause 22, wherein the intensity threshold is used to generate a contour of the reference feature, wherein the contour is used to generate the skeleton of the reference feature.

24. The computer-readable medium of clause 21, wherein determining the status value for each portion of the reference feature includes:
  determining the status value for each point on the skeleton.

25. The computer-readable medium of clause 24, the method further comprising:
  determining the status threshold as a function of a maximum and/or minimum of the status values of the set of points on the skeleton.

26. The computer-readable medium of clause 21, wherein generating the training data for each portion of the reference feature includes:
  generating the location data and the presence value for each point on the skeleton of the reference feature.

27. A non-transitory computer-readable medium having instructions that, when executed by a computer, cause the computer to execute a method for generating a characteristic pattern, the method comprising:
  obtaining a contour of a reference feature from a reference image;
  executing, by a hardware computer system and using the contour, a machine learning model for determining a preferred assist feature set to be placed around the contour, and wherein the preferred assist feature set has a reward value that is highest among reward values of a plurality of assist feature sets, and wherein the reward value is calculated as a function of an intensity threshold used to generate the contour; and
  generating the characteristic pattern with the contour and the preferred assist feature set.

28. The computer-readable medium of clause 27, wherein the characteristic pattern is used for manufacturing a mask pattern that is used for printing a target pattern on a substrate.

29. The computer-readable medium of clause 27, wherein the reference image is a CTM image.

30. The computer-readable medium of clause 27, wherein executing the machine learning model to determine the preferred assist feature set includes:
  generating a skeleton of the contour, wherein the skeleton includes a set of points,
  selecting a plurality of cut-off points on the skeleton, wherein each cut-off point segments the skeleton into a plurality of segments, and
  for each cut-off point, generating an assist feature set of the plurality of assist feature sets, wherein the assist feature set has an assist feature for each segment of the plurality of segments, wherein the assist feature set is generated based on a set of constraints and a distance value associated with each point on the skeleton.

31. The computer-readable medium of clause 30, the method further comprising:
  determining the reward value of the assist feature set as a function of (a) intensity value associated with each point of the skeleton that is located within the assist feature set, and (b) the intensity threshold, and
  selecting one of the assist feature sets having a highest reward value as the preferred assist feature set.

32. The computer-readable medium of clause 30 further comprising:
  a. generating, using the preferred assist feature set, training data for training a second machine learning model to generate a second characteristic pattern based on a second reference image.

33. The computer-readable medium of clause 32, wherein the training data includes training data for a plurality of preferred assist feature sets generated for a plurality of contours from the reference image.

34. The computer-readable medium of clause 33, wherein generating the training data includes:
   generating coordinates of each point of the skeleton of the contour, and
   generating a presence value associated with each point of the skeleton, wherein the presence value indicates whether the corresponding point is located within the preferred assist feature set.

35. The computer-readable medium of clause 34, wherein generating the coordinates of each point includes generating coordinates of a pixel corresponding to the point in the reference image.

36. The computer-readable medium of clause 34, wherein generating the presence value includes:
   determining a status value for each point of the skeleton as a function of the reward value of the plurality of assist feature sets and a number of assist feature sets in which the corresponding point is determined to be located within,
   determining a status threshold as a function of maximum status value and a minimum status value of the set of points of the skeleton, and
   generating the presence value for each point of the skeleton, wherein the presence value is set to a first value if the status value of the corresponding point satisfies the status threshold, the first value indicating that the corresponding point is located within the preferred assist feature set.

37. The computer-readable medium of clause 32, the method further comprising:
   training, based on the training data, the second machine learning model such that a cost function that determines a difference between a predicted presence value and the presence value is minimized 38. A non-transitory computer-readable medium having instructions that, when executed by a computer, cause the computer to execute a method for generating a characteristic pattern for a mask pattern, the method comprising:
   obtaining a reference image having reference features;
   obtaining a contour of a reference feature of the reference features from the reference image;
   generating a skeleton of the contour;
   determining, via executing a machine learning model using the skeleton, a presence value indicating whether each point of a set of points on the skeleton is located within a preferred assist feature set to be generated for placement around the reference feature; and
   generating a characteristic pattern using the presence value.

39. The computer-readable medium of clause 38, wherein the characteristic pattern is a pixelated image that includes the preferred assist feature set placed in relation to the contour.

40. The computer-readable medium of clause 38, wherein the set of points includes (a) a covered set of points that is predicted to located within the preferred assist feature set, and (b) an uncovered set of points that is predicted not to be located within the preferred assist feature set.

41. The computer-readable medium of clause 40, wherein generating the characteristic pattern using the presence value includes:
   (i) selecting a point from the uncovered set of points as a cut-off point, wherein the cut-off point divides the skeleton into a plurality of segments,
   (ii) generating a first assist feature set having an assist feature for each segment of the plurality of segments, wherein the assist feature is generated based on (a) a distance value associated with each point of the set of points, and (b) a set of constraints the reference assist feature has to satisfy for manufacturing of the mask pattern,
   (iii) determining a reward value associated with the first assist feature set as a function of (a) intensity value associated with each point located within the first assist feature set, and (b) an intensity threshold that is used in obtaining the contour,
   iterating through steps (i), (ii) and (iii) by selecting a different cut-off point from the uncovered set of points, generating another assist feature set, and determining their corresponding reward value, and
   determining one of the assist feature sets that has a highest reward value as the preferred assist feature set for placement in relation to the reference feature.

42. The computer-readable medium of clause 41, wherein generating the first assist feature set includes performing a random perturbation on the first assist feature set and applying the set of constraints to the first assist feature set.

43. The computer-readable medium of clause 38, wherein generating the characteristic pattern includes generating the characteristic pattern with a plurality of preferred assist feature sets for placement in relation to a plurality of reference features from the reference image.

44. The computer-readable medium of clause 38, wherein the reference image is a CTM image.

45. A method for training a machine learning model to generate a characteristic pattern for a mask pattern, the method comprising:
   obtaining training data associated with a reference feature in a reference image used in generating the mask pattern, wherein the training data includes (i) location data of each portion of a plurality of portions of the reference feature, and (ii) a presence value indicating whether the portion of the reference feature is located within a reference assist feature generated for the reference feature; and
   training, by a hardware computer system and based on the training data associated with the reference feature, the machine learning model such that a metric between a predicted presence value and the presence value is minimized 46. A method for generating a characteristic pattern for a mask pattern, the method comprising:
   obtaining a contour of a reference feature from a reference image; and
   executing, by a hardware computer system and using the contour, a machine learning model for determining a preferred assist feature to be placed around the contour, and wherein the preferred assist feature has a reward value that is highest among reward values of a plurality of reference assist features, and wherein the reward value is calculated as a function of an intensity threshold used to generate the contour; and
   generating the characteristic pattern with the contour and the preferred assist feature.

47. A method for generating a characteristic pattern for a mask pattern, the method comprising:
   obtaining a reference image having reference features;
   obtaining a contour of a reference feature from the reference image;
   generating a skeleton of the contour;
   determining, by a hardware system and via executing a machine learning model using the skeleton, a presence value indicating whether each point of a set of points on the skeleton is located within a preferred assist feature to be generated for placement around the reference feature; and generating a characteristic pattern using the presence value.

48. A non-transitory computer-readable medium having instructions recorded thereon, the instructions when executed by a computer implementing the method of any of the above clauses.

The descriptions above are intended to be illustrative, not limiting. Thus, it will be apparent to one skilled in the art that modifications may be made as described without departing from the scope of the claims set out below.

The invention claimed is:

1. A non-transitory computer-readable medium having instructions therein that, when executed by a computer system, are configured to cause the computer to at least:
   obtain training data associated with a reference feature in a reference image, wherein the training data includes (i) location data of a portion of the reference feature, and (ii) a presence value indicating whether the portion of the reference feature is located within a reference assist feature generated for the reference feature; and
   train, based on the training data, a machine learning model configured to generate a characteristic pattern, such that a metric between a predicted presence value and the presence value is minimized.

2. The computer-readable medium of claim 1, wherein the reference image is a continuous transmission mask (CTM) image generated by simulation of an optical proximity correction process using a target pattern, and wherein the reference feature corresponds to a target feature from the target pattern.

3. The computer-readable medium of claim 1, wherein the reference assist feature includes one or more sub-resolution assist features placed around the reference feature, the one or more sub-resolution assist features being rectilinear in shape.

4. The computer-readable medium of claim 1, wherein the training data includes training data for a plurality of reference features in one or more reference images.

5. The computer-readable medium of claim 1, wherein the location data includes location data of each portion of a plurality of portions of the reference feature.

6. The computer-readable medium of claim 1, wherein the instructions configured to cause the computer system to train the machine learning model are further configured to cause the computer system to:
   (a) execute, the machine learning model, using the training data, to output the predicted presence value associated with the corresponding portion of the reference feature;
   (b) determine the metric between the predicted presence value and the presence value;
   (c) adjust the machine learning model such that the metric is reduced;
   (d) determine whether the metric is minimized; and
   (e) responsive to the metric not being minimized, perform (a), (b), (c), and (d).

7. The computer-readable medium of claim 1, wherein the instructions are further configured to cause the computer system to:
   obtain a specified reference image; and
   determine, via execution of the machine learning model using the specified reference image, a preferred assist feature for placement in relation to a specified feature of the specified reference image, wherein the specified feature corresponds to a target feature of a target pattern to be printed on the substrate.

8. The computer-readable medium of claim 7, wherein the instructions are further configured to cause the computer system to generate a characteristic pattern with the preferred assist feature, wherein the characteristic pattern is a pixelated image that includes the preferred assist feature placed in relation to the specified feature.

9. The computer-readable medium of claim 8, wherein the instructions configured to cause the computer system to generate the characteristic pattern are further configured to cause the computer system to generate the characteristic pattern with a plurality of preferred assist features, wherein the preferred assist features are placed in relation to a plurality of reference features of the specified reference image, and wherein the preferred assist features are determined by execution of the machine learning model for the reference features.

10. The computer-readable medium of claim 7, wherein the instructions configured to cause the computer system to determine the preferred assist feature are further configured to cause the computer system to:
   obtain, from the specified reference image and using an intensity threshold, a specified contour of the specified feature,
   generate a skeleton of the specified contour,
   input location data and distance data to the machine learning model, wherein the location data includes coordinates of a set of points on the skeleton and the distance data indicates a closest distance from a point of the set of points to the specified contour, and
   obtain, from the machine learning model, a predicted presence value for each point of the set of points, wherein the predicted presence value indicates whether the corresponding point is predicted to be located within the preferred assist feature.

11. The computer-readable medium of claim 10, wherein the instructions are further configured to cause the computer system to:
   generate a plurality of assist feature sets to cover points from the covered set of points,
   determine a reward value for each assist feature set using a scoring function, and
   determine a first assist feature set of the assist feature sets having a highest reward value as the preferred assist feature for placement in relation to the specified contour.

12. The computer-readable medium of claim 1, wherein the instructions configured to cause the computer system to obtain the training data are further configured to cause the computer system to:
   generate a plurality of assist feature sets for the reference feature based on a set of constraints for manufacturing of a mask pattern, wherein each assist feature set is associated with a reward value that is determined based on a specified scoring function,
   determine a specified assist feature set of the plurality of assist feature sets associated with a highest reward value as the reference assist feature,
   determine a status value for each portion of the reference feature as a function of the reward value of the plurality of assist feature sets and a number of assist feature sets in which the corresponding portion is determined to be located within, and
   generate the location data and the presence value of the training data for each portion of the reference feature, wherein the presence value is set to a first value if the status value of the corresponding portion satisfies a status threshold, the first value indicating that the corresponding portion is located within the reference assist feature.

13. The computer-readable medium of claim 12, wherein the instructions configured to cause the computer system to generate the presence value are further configured to cause the computer system to set the presence value to a second value if the status value of the corresponding portion does not satisfy the status threshold, the second value indicating that the corresponding portion is not located within the reference assist feature.

14. The computer-readable medium of claim 12, wherein the instructions configured to cause the computer system to generate the plurality of assist feature sets are further configured to cause the computer system to:
generate a skeleton of the reference feature,
select a plurality of cut-off points on the skeleton, wherein each cut-off point segments the skeleton into a plurality of segments, and
for each cut-off point, generate an assist feature set having a reference assist feature for each segment of the plurality of segments, wherein the assist feature set is generated based on the set of constraints and a distance value associated with each point of a set of points on the skeleton.

15. The computer-readable medium of claim 14, wherein the instructions configured to cause the computer system to determine the specified assist feature set having the highest reward value are further configured to cause the computer system to determine, using the specified scoring function, the reward value of an assist feature set of the plurality of assist feature sets as a function of (a) image intensity value within the assist feature set, and (b) an intensity threshold.

16. The computer-readable medium of claim 14, wherein the instructions configured to cause the computer system to generate the training data for each portion of the reference feature are further configured to cause the computer system to generate the location data and the presence value for each point on the skeleton of the reference feature.

17. A method for training a machine learning model to generate a characteristic pattern, the method comprising:
obtaining training data associated with a reference feature in a reference image, wherein the training data includes (i) location data of a portion of the reference feature, and (ii) a presence value indicating whether the portion of the reference feature is located within a reference assist feature generated for the reference feature; and
training, based on the training data, the machine learning model such that a metric between a predicted presence value and the presence value is minimized.

18. The method of claim 17, wherein the reference image is a continuous transmission mask (CTM) image generated by simulation of an optical proximity correction process using a target pattern, and wherein the reference feature corresponds to a target feature from the target pattern.

19. The method of claim 17, further comprising:
obtaining a specified reference image; and
determining, via executing the machine learning model using the specified reference image, a preferred assist feature for placement in relation to a specified feature of the specified reference image, wherein the specified feature corresponds to a target feature of a target pattern to be printed on the substrate.

20. The method of claim 17, wherein the obtaining the training data includes:
generating a plurality of assist feature sets for the reference feature based on a set of constraints for manufacturing of a mask pattern, wherein each assist feature set is associated with a reward value that is determined based on a specified scoring function,
determining a specified assist feature set of the plurality of assist feature sets associated with a highest reward value as the reference assist feature,
determining a status value for each portion of the reference feature as a function of the reward value of the plurality of assist feature sets and a number of assist feature sets in which the corresponding portion is determined to be located within, and
generating the location data and the presence value of the training data for each portion of the reference feature, wherein the presence value is set to a first value if the status value of the corresponding portion satisfies a status threshold, the first value indicating that the corresponding portion is located within the reference assist feature.

* * * * *